(12) United States Patent
Higashikawa et al.

(10) Patent No.: US 11,575,053 B2
(45) Date of Patent: Feb. 7, 2023

(54) PHOTOVOLTAIC DEVICE AND SOLAR CELL MODULE INCLUDING SAME

(71) Applicant: SHARP KABUSHIKI KAISHA, Sakai (JP)

(72) Inventors: Makoto Higashikawa, Sakai (JP); Yixiao Song, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/610,675

(22) PCT Filed: May 10, 2018

(86) PCT No.: PCT/JP2018/018064
§ 371 (c)(1),
(2) Date: Nov. 4, 2019

(87) PCT Pub. No.: WO2018/207859
PCT Pub. Date: Nov. 15, 2018

(65) Prior Publication Data
US 2020/0161484 A1 May 21, 2020

(30) Foreign Application Priority Data
May 10, 2017 (JP) .............................. JP2017-093770

(51) Int. Cl.
*H01L 31/0224* (2006.01)
*H01L 31/05* (2014.01)
*H01L 31/0747* (2012.01)

(52) U.S. Cl.
CPC .. *H01L 31/022441* (2013.01); *H01L 31/0516* (2013.01); *H01L 31/0747* (2013.01)

(58) Field of Classification Search
CPC ......... H01L 31/0747; H01L 31/022441; H01L 31/022425; H01L 31/0682; H01L 31/0516; H01L 31/0512; H01L 31/0508
See application file for complete search history.

(56) References Cited

U.S. PATENT DOCUMENTS 6,091,019 A * 7/2000 Sakata ................ H01L 31/0747
136/256
8,636,198 B1 * 1/2014 Linderman ......... H01L 31/0508
228/248.1

(Continued)

FOREIGN PATENT DOCUMENTS

JP 2002-280591 A 9/2002
JP 2008-135654 A 6/2008
(Continued)

*Primary Examiner* — Andrew J Golden
(74) *Attorney, Agent, or Firm* — ScienBiziP, P.C.

(57) ABSTRACT

A photovoltaic device including: a first amorphous semiconductor layer (3) and a second amorphous semiconductor layer (4) both on a back face of a semiconductor substrate (1); electrodes (5, 6); and a wiring board (8). The electrodes (5, 6) are disposed on the first amorphous semiconductor layer (3) and the second amorphous semiconductor layer (4) respectively. The wiring board (8) has wires (82) connected to the electrodes (5) by a conductive adhesive layer (7). The wiring board (8) has wires (83) connected to the electrodes (5) by the conductive adhesive layer (7). The electrodes (5) include conductive layers (51, 52). The electrodes (6) include conductive layers (61, 62). The conductive layers (51, 61) are composed primarily of silver. The conductive layers (52, 62) cover the conductive layers (51, 52) respectively. Each conductive layer (52, 62) is composed of a metal more likely to be oxidized than silver.

5 Claims, 9 Drawing Sheets

(56) References Cited

U.S. PATENT DOCUMENTS

| | | | |
|---|---|---|---|
| 2008/0121266 A1 | 5/2008 | Tsunomura et al. | |
| 2010/0018563 A1* | 1/2010 | Yoshimine | H01L 31/0747 136/244 |
| 2010/0243024 A1* | 9/2010 | Hashimoto | H01L 31/0747 136/244 |
| 2011/0017261 A1* | 1/2011 | Saita | H01L 31/0512 136/244 |
| 2011/0272006 A1* | 11/2011 | Sainoo | H01L 31/0516 136/251 |
| 2012/0024371 A1 | 2/2012 | Funakoshi | |
| 2012/0291846 A1* | 11/2012 | Mikami | H01L 31/022441 136/244 |
| 2013/0104976 A1 | 5/2013 | Yasutake | |
| 2013/0125951 A1* | 5/2013 | Sakuma | H01L 31/0508 136/244 |
| 2013/0306143 A1* | 11/2013 | Yamada | H01L 31/0516 136/256 |
| 2015/0129037 A1 | 5/2015 | Nam et al. | |
| 2015/0243818 A1 | 8/2015 | Kim et al. | |
| 2016/0163898 A1* | 6/2016 | Harada | H01L 31/0747 136/255 |
| 2016/0268458 A1 | 9/2016 | Kimoto et al. | |

FOREIGN PATENT DOCUMENTS

| | | |
|---|---|---|
| JP | 2010-262979 A | 11/2010 |
| JP | 2014-036069 A | 2/2014 |
| JP | 2015-095653 A | 5/2015 |
| JP | 2015-159286 A | 9/2015 |
| JP | 2016-046362 A | 4/2016 |
| WO | 2012-002270 A1 | 1/2012 |
| WO | 2015-060432 A1 | 4/2015 |
| WO | 2016-027530 A1 | 2/2016 |

* cited by examiner (f)

(g)

(h)

(i)

PHOTOVOLTAIC DEVICE AND SOLAR CELL MODULE INCLUDING SAME

TECHNICAL FIELD

The present invention relates to photovoltaic devices and solar cell modules including photovoltaic devices.

BACKGROUND ART

Japanese Unexamined Patent Application Publication, Tokukai, No. 2016-46362 discloses a heterojunction back-contact solar cell with a wiring sheet as a photovoltaic device.

The photovoltaic device includes a heterojunction back-contact solar cell and a wiring sheet. The heterojunction back-contact solar cell includes: either a first-conductivity-type semiconductor substrate or a second-conductivity-type semiconductor substrate; a first-conductivity-type amorphous semiconductor film on one of the sides of the semiconductor substrate; a second-conductivity-type amorphous semiconductor film on one of the sides of the semiconductor substrate; a first electrode on the first-conductivity-type amorphous semiconductor film; and a second electrode on the second-conductivity-type amorphous semiconductor film.

The wiring sheet includes: an insulating base member; and a first wire and a second wire on the insulating base member. The first electrode is electrically connected to the first wire, and the second electrode is electrically connected to the second wire. Japanese Unexamined Patent Application Publication, Tokukai, No. 2016-46362 further discloses that either the first electrode has a width greater than or equal to that of the first wire or the second electrode has a width greater than or equal to that of the second wire, or both of these relationships hold.

PCT International Application Publication No. WO2015/060432 discloses a back-contact solar cell as a photovoltaic device. The photovoltaic device includes: a semiconductor substrate; a first semiconductor layer of a first conductivity type; a second semiconductor layer of a second conductivity type that is opposite to the first conductivity type; a first electrode on the first semiconductor layer; and a second electrode on the second semiconductor layer. The first electrode includes: a first conductive layer; and a second conductive layer in contact with the first conductive layer. The first conductive layer contains a first metal as a primary component, and the second conductive layer contains a second metal that is more likely to be oxidized than the first metal.

Japanese Unexamined Patent Application Publication, Tokukai, No. 2015-95653 discloses a solar cell that includes: a photoelectric conversion section including a first-conductivity-type region and a second-conductivity-type region formed on the same side; and an electrode provided on the photoelectric conversion section and including an adhesive layer on the photoelectric conversion section and an electrode layer on the adhesive layer. The adhesive layer has a thermal expansion coefficient larger than that of the photoelectric conversion section and smaller than that of the electrode layer.

SUMMARY OF INVENTION

Japanese Unexamined Patent Application Publication, Tokukai, No. 2016-46362 specifies the widths of electrodes and wires in a heterojunction back-contact solar cell with a wiring sheet in order to restrain degradation of device characteristics. PCT International Application Publication No. WO2015/060432 specifies the structure of electrodes for a photoelectric conversion layer in order to restrain degradation of device characteristics. Japanese Unexamined Patent Application Publication, Tokukai, No. 2015-95653 uses an adhesive layer provided on a photoelectric conversion section as an electrode for the solar cell and specifies the thermal expansion coefficient of the adhesive layer, in order to restrain degradation of device characteristics.

If silver is used as a primary component of an electrode that is in contact with an amorphous thin film, however, there is a problem that device characteristics are degraded in a structure where the electrode is partially connected to a wire.

Japanese Unexamined Patent Application Publication, Tokukai, No. 2015-95653 uses an adhesive layer provided on a photoelectric conversion section and does not use an electrode composed primarily of silver for the electrode layer that is in direct contact with an amorphous thin film. Japanese Unexamined Patent Application Publication, Tokukai, No. 2016-46362 and PCT International Application Publication No. WO2015/060432 do not give a detailed description of electrodes and wire-connecting structures. Therefore, Japanese Unexamined Patent Application Publication, Tokukai, No. 2016-46362, PCT International Application Publication No. WO2015/060432, and Japanese Unexamined Patent Application Publication, Tokukai, No. 2015-95653 all fall short of solving the problem mentioned above.

Accordingly, the present invention, in an embodiment thereof, provides a photovoltaic device capable of restraining degradation of device characteristics, by using silver as a primary component of the electrode that is in direct contact with an amorphous thin film.

The present invention, in an embodiment thereof, also provides a solar cell module including photovoltaic devices capable of restraining degradation of device characteristics, by using silver as a primary component of the electrode that is in direct contact with an amorphous thin film.

Structure 1

The present invention, in an embodiment thereof, is directed to a photovoltaic device including a semiconductor substrate, a first amorphous semiconductor layer, a second amorphous semiconductor layer, a first electrode, a second electrode, a first wire, and a second wire. The semiconductor substrate is of a first conductivity type. The first amorphous semiconductor layer is of the first conductivity type and disposed on one of the faces of the semiconductor substrate. The second amorphous semiconductor layer is of a second conductivity type and disposed on one of the faces of the semiconductor substrate, the second conductivity type being opposite to the first conductivity type. The first electrode is electrically connected to the first amorphous semiconductor layer. The second electrode is electrically connected to the second amorphous semiconductor layer. The first wire is connected to a portion of the first electrode via a conductive adhesive layer and connected electrically to the first electrode. The second wire is connected to a portion of the second electrode via a conductive adhesive layer and connected electrically to the second electrode. The first electrode is disposed in contact with the first amorphous semiconductor layer and includes: a first conductive layer composed primarily of silver; and a second conductive layer disposed between the first conductive layer and the first wire, the second conductive layer being composed of a metal more likely to be oxidized than silver. The second electrode is disposed in contact with the second amorphous semiconductor layer and includes: a third conductive layer composed primarily of silver; and a fourth conductive layer disposed between the third conductive layer and the second wire, the fourth conductive layer being composed of a metal more likely to be oxidized than silver. The second conductive layer has a portion facing the first wire. The fourth conductive layer has a portion facing the second wire.

According to structure 1, the second electrode has a portion connected to the second wire via the conductive adhesive layer and has the other portion facing the second wire. Meanwhile, the first electrode has a portion connected to the first wire via the conductive adhesive layer and has the other portion facing the first wire. The first and second electrodes are partially connected to the first and second wires respectively via the conductive adhesive layer. This arrangement, where the first and second electrodes are connected to the first and second wires respectively with sufficient mechanical strength and connected partially to the first and second wires, relieves the stress applied to the first and second electrodes.

The first and second electrodes are in contact with the first and second amorphous semiconductor layers respectively and include the first and third conductive layers composed primarily of silver. The first and second electrodes have such a high reflectance as to reflect the light having been transmitted, without being absorbed, by the semiconductor substrate, the first amorphous semiconductor layer, and the second amorphous semiconductor layer, back toward the light-incident side of the semiconductor substrate, which increases short-circuit photocurrent.

Additionally, the first and third conductive layers, composed primarily of silver, can form relatively good electrical contacts with the first amorphous semiconductor layer and the second amorphous semiconductor layer respectively.

In addition, since the first and second electrodes include the second and fourth conductive layers covering the first and third conductive layers respectively and composed primarily of a metal more likely to be oxidized than silver, the surfaces of the second and fourth conductive layers are oxidized before the first and third conductive layers respectively. A thin film of oxide, formed on the surfaces of the second and fourth conductive layers, reduces oxygen penetration, thereby preventing oxygen from reaching the first and third conductive layers (which are composed of silver). Additionally, the second and fourth conductive layers face the first and second wires respectively at locations where the conductive adhesive layer provides no adhesion. The surfaces of the second and fourth conductive layers are directly exposed to an oxygen-containing atmosphere. These arrangements form a finer oxide film on the surfaces of the second and fourth conductive layers. This oxide film is enhanced and maintained by an oxygen-containing atmosphere while the photovoltaic device is being used. This mechanism restrains oxidation of the first amorphous semiconductor layer and the second amorphous semiconductor layer and hence restrains detachment of the first and second electrodes.

These various factors restrain degradation of characteristics of the photovoltaic device including electrodes composed primarily of silver.

Structure 2

In structure 1, the photovoltaic device includes either one or both of a structure where the second conductive layer is in direct contact with the first wire and a structure where the fourth conductive layer is in direct contact with the second wire.

According to structure 2, the first electrode is partially in direct contact with the first wire and/or the second electrode is partially in direct contact with the second wire. The electrodes are covered by the second conductive layer and/or the fourth conductive layer. The surfaces of the second conductive layer and/or the fourth conductive layer are oxidized before silver. A thin film of oxide, formed on the surface(s) of the second conductive layer and/or the fourth conductive layer, reduces oxygen penetration, thereby preventing oxygen from reaching the silver. Moreover, since the electrodes are in contact with the wires, the electrodes can be additionally connected to wires.

Structure 3

In structure 1 or 2, the photovoltaic device includes either one or both of a structure where the second conductive layer is composed of a metal more likely to be oxidized than the first wire and a structure where the fourth conductive layer is composed of a metal more likely to be oxidized than the second wire.

According to structure 3, the second conductive layer and the fourth conductive layer are composed of a metal more likely to be oxidized than the first wire and the second wire respectively. This arrangement prevents the wires from being oxidized before the second conductive layer and the fourth conductive layer, thereby forming good electrical connections. Chemical reactions may proceed electrochemically if there exists a mixed combination of portions where the electrodes are connected to the wires by the conductive adhesive layer and portions where the electrodes are not adhered to the wires by the conductive adhesive layer. Structure 3 is therefore desirable.

Structure 4

In any one of structures 1 to 3, the photovoltaic device includes either one or both of a structure where the second conductive layer is composed of a metal with a higher hardness than the first wire and a structure where the fourth conductive layer is composed of a metal with a higher hardness than the second wire.

According to structure 4, the second conductive layer and the fourth conductive layer are composed of a metal with a higher hardness than the first wire and the second wire respectively. This arrangement prevents scratches. Scratches on the second and fourth conductive layers due to the contact of the electrodes and wires should be avoided in forming connections by means of the conductive adhesive layer because such scratches would damage the oxide film formed primarily of a metal that is more likely to be oxidized than the silver on the surfaces of the second and fourth conductive layers and could allow oxygen to penetrate into the silver.

If the second and fourth conductive layers are partially connected electrically to wires via the conductive adhesive layer, the electrodes are often in direct contact with the wires during and after manufacture. Structure 4 is therefore desirable.

Structure 5

In any one of structures 1 to 4, the second and fourth conductive layers are composed primarily of nickel.

According to structure 5, the second and fourth conductive layers are composed primarily of nickel. Nickel oxide, in particular, forms a fine oxide film. Structure 5 is desirable from the viewpoint of prevention of oxygen penetration. In addition, the second and fourth conductive layers, although being extremely thin, can still form a suitable adhesive layer with a conductive adhesive, thereby preventing oxygen penetration in the vicinity of the conductive adhesive layer.

Structure 5 is therefore desirable. Using an alloy of nickel and a suitable substance can improve these effects and is therefore desirable.

Structure 6

The present invention, in an embodiment thereof, is directed to a solar cell module including a photovoltaic device of any one of structures 1 to 5.

According to structure 6, the solar cell module, including a photovoltaic device of any one of structures 1 to 5, exhibits high efficiency because the electrode layer in direct contact with an amorphous thin film includes the first and third conductive layers composed primarily of silver. The solar cell module can also prevent electrode detachment and minimize degradation of device characteristics in long-term outdoor use because the electrodes are partially connected to the wires.

Advantageous Effects of Invention

The present invention, in an embodiment thereof, provides a photovoltaic device capable of restraining degradation of device characteristics, by using silver as a primary component of the electrode that is in direct contact with an amorphous thin film.

DESCRIPTION OF EMBODIMENTS

Figure 1:
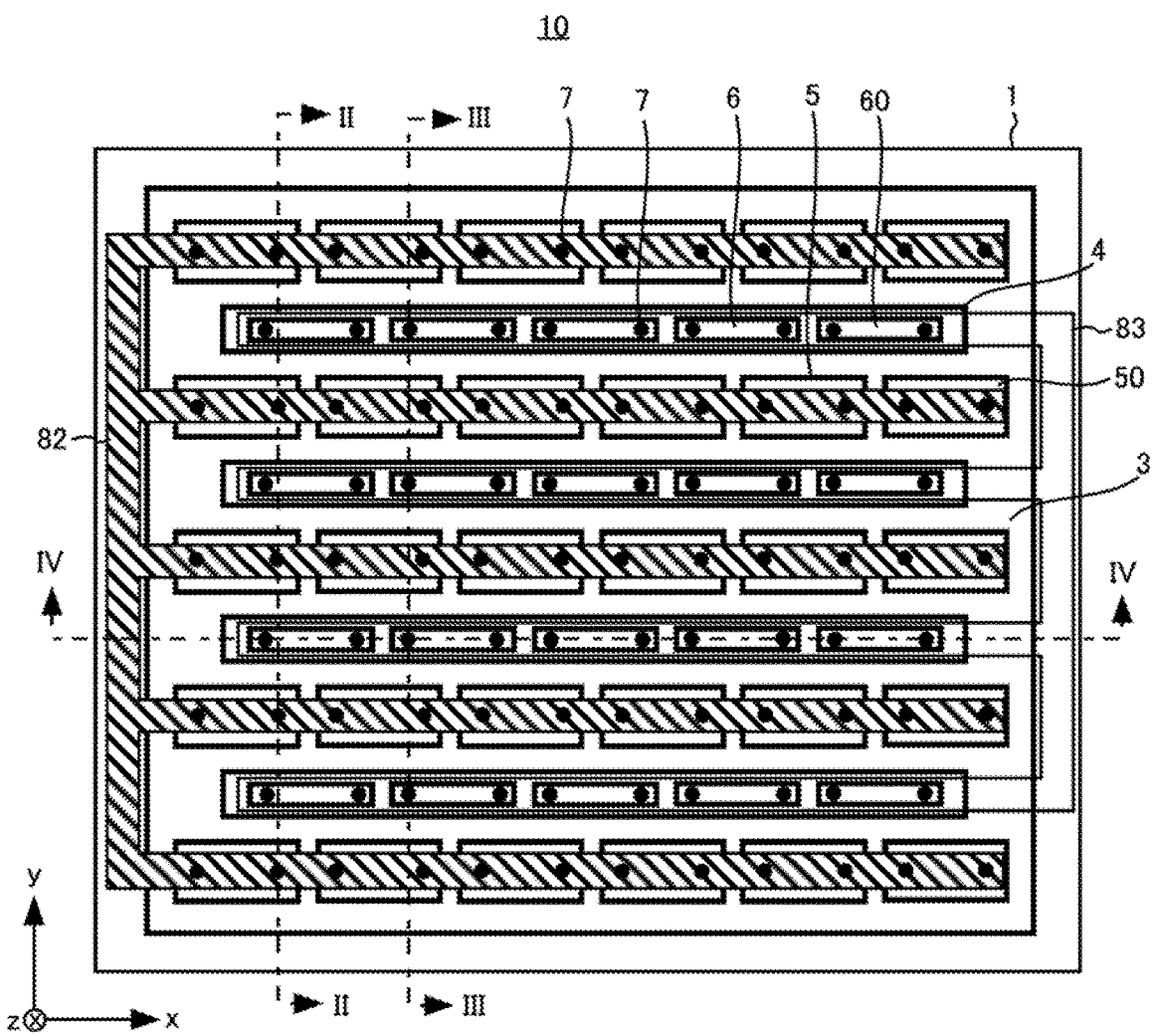
FIG. 1 is a plan view of a photovoltaic device in accordance with Embodiment 1.

The following will describe embodiments of the present invention in detail with reference to drawings. Identical or equivalent elements are indicated by the same reference numerals in the drawings, and description thereof is not repeated.

Embodiment 1

Figure 2:
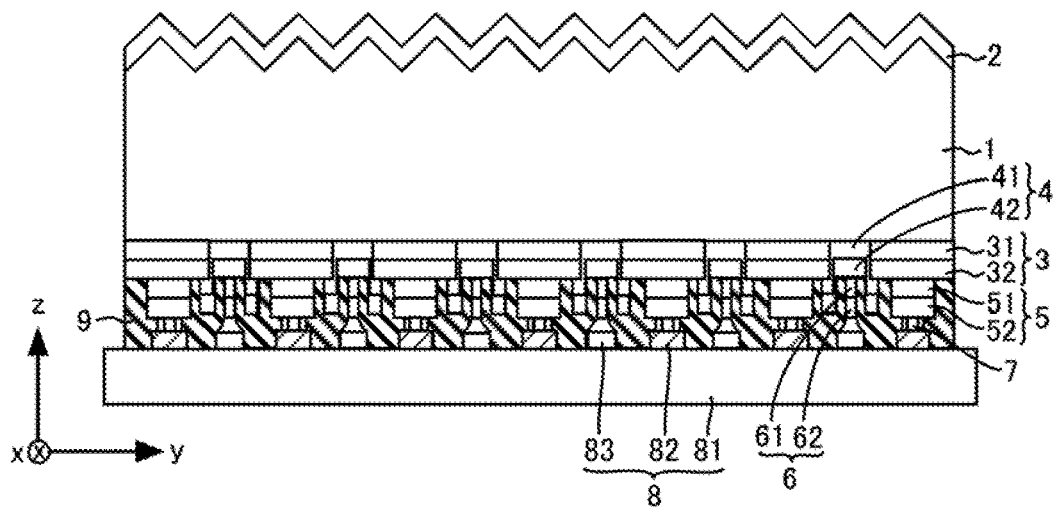
FIG. 2 is a cross-sectional view of the photovoltaic device shown in FIG. 1 taken along line II-II.
Figure 3:
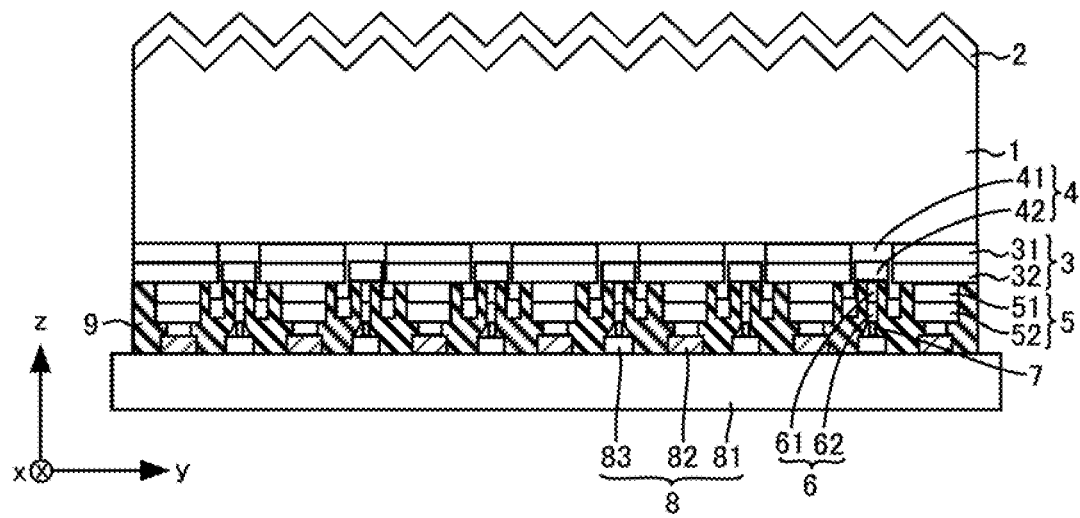
FIG. 3 is a cross-sectional view of the photovoltaic device shown in FIG. 1 taken along line III-III.
Figure 4:
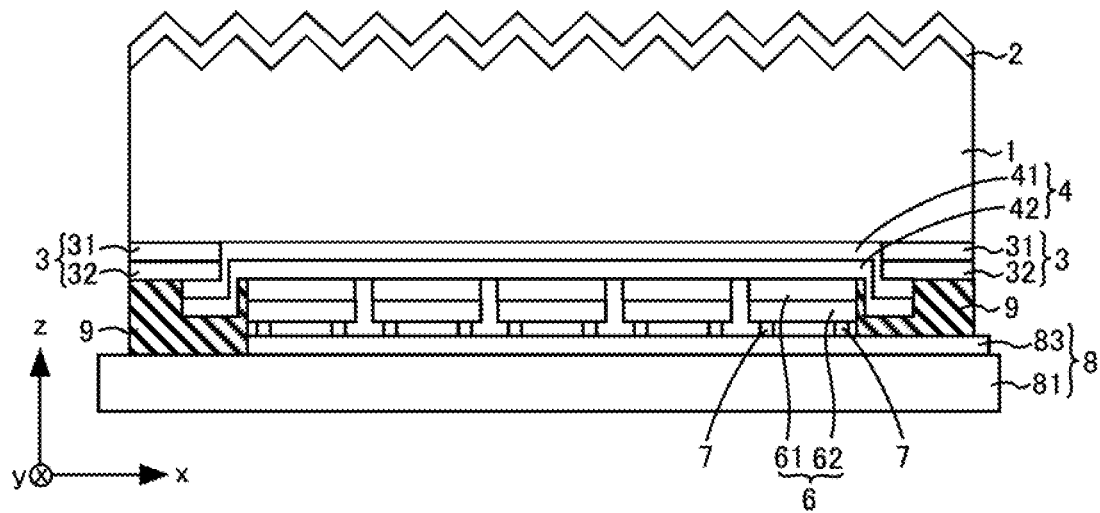
FIG. 4 is a cross-sectional view of the photovoltaic device shown in FIG. 1 taken along line IV-IV.

FIG. 1 is a plan view of a photovoltaic device in accordance with Embodiment 1. FIG. 2 is a cross-sectional view of the photovoltaic device shown in FIG. 1 taken along line II-II. FIG. 3 is a cross-sectional view of the photovoltaic device shown in FIG. 1 taken along line III-III. FIG. 4 is a cross-sectional view of the photovoltaic device shown in FIG. 1 taken along line IV-IV. Note that FIG. 1 shows the photovoltaic device as it is viewed from a side opposite a light-incident side.

Referring to FIGS. 1 to 4, a photovoltaic device 10 in accordance with Embodiment 1 includes a semiconductor substrate 1, an antireflective film 2, a first amorphous semiconductor layer 3, a second amorphous semiconductor layer 4, electrodes 5 and 6, a conductive adhesive layer 7, a wiring board 8, and an insulating adhesive layer 9.

The semiconductor substrate 1 is composed of, for example, a n-type monocrystalline silicon substrate and has a thickness of 100 to 200 μm. For example, the semiconductor substrate 1 has a (100) crystal orientation and a specific resistance of 1 to 10 Ωcm. The semiconductor substrate 1 has texture on a light-incident side surface thereof.

The antireflective film 2 is disposed on the light-incident side surface of the semiconductor substrate 1. The antireflective film 2 includes, for example, a stack of silicon oxide and silicon nitride. In this example, the silicon oxide is in contact with the semiconductor substrate 1, and the silicon nitride is in contact with the silicon oxide. The antireflective film 2 has a thickness of, for example, 100 to 1,000 nm.

The first amorphous semiconductor layer 3 is disposed on the surface opposite the light-incident side surface of the semiconductor substrate 1. In this example, the first amorphous semiconductor layer 3 is arranged so as to surround the second amorphous semiconductor layer 4 in the x-y plane. The first amorphous semiconductor layer 3 includes an i-type amorphous semiconductor layer 31 and a p-type amorphous semiconductor layer 32.

The i-type amorphous semiconductor layer 31 is disposed on the semiconductor substrate 1 in contact with the semiconductor substrate 1. The i-type amorphous semiconductor layer 31 is composed of, for example, i-type amorphous silicon, i-type amorphous silicon carbide, i-type amorphous silicon nitride, i-type amorphous silicon oxide, or i-type amorphous silicon nitride oxide. The i-type amorphous semiconductor layer 31 has a thickness of, for example, 5 to 30 nm.

The "i-type" semiconductor does not only refer to a completely intrinsic semiconductor, but also encompasses semiconductors contaminated with a n- or p-type impurity of sufficiently low concentration (both the n-type impurity concentration and the p-type impurity concentration are lower than $1 \times 10^{15}$ atoms/cm$^3$).

The "amorphous silicon," throughout the embodiments of the present invention, does not only refer to amorphous silicon having silicon atoms with a dangling bond (i.e., an unhydrogenated end), but also encompasses hydrogenated amorphous silicon and other like silicon having no atoms with a dangling bond.

The p-type amorphous semiconductor layer 32 is disposed on the i-type amorphous semiconductor layer 31 in contact with the i-type amorphous semiconductor layer 31. The p-type amorphous semiconductor layer 32 is composed of, for example, p-type amorphous silicon, p-type amorphous silicon carbide, p-type amorphous silicon nitride, p-type amorphous silicon oxide, or p-type amorphous silicon nitride oxide. The p-type amorphous semiconductor layer 32 has a thickness of, for example, 5 to 30 nm.

The p-type amorphous semiconductor layer 32 may contain, for example, boron (B) as a p-type impurity. The "p-type" semiconductor, throughout the embodiments of the present invention, has a p-type impurity concentration of at least $1\times10$ atoms/cm$^3$.

The second amorphous semiconductor layer 4 is disposed on the surface opposite the light-incident side surface of the semiconductor substrate 1 and elongated in a first direction (x-axis direction). The second amorphous semiconductor layer 4 and the first amorphous semiconductor layer 3 are located at different positions when viewed in the width direction (y-axis direction) of the second amorphous semiconductor layer 4 that is perpendicular to the first direction (x-axis direction). The second amorphous semiconductor layer 4 includes an i-type amorphous semiconductor layer 41 and a n-type amorphous semiconductor layer 42.

The i-type amorphous semiconductor layer 41 is disposed on the semiconductor substrate 1 in contact with the semiconductor substrate 1. The i-type amorphous semiconductor layer 41 is composed of, for example, i-type amorphous silicon, i-type amorphous silicon carbide, i-type amorphous silicon nitride, i-type amorphous silicon oxide, or i-type amorphous silicon nitride oxide. The i-type amorphous semiconductor layer 41 has a thickness of, for example, 5 to 30 nm.

The n-type amorphous semiconductor layer 42 is disposed on the i-type amorphous semiconductor layer 41 in contact with the i-type amorphous semiconductor layer 41. The n-type amorphous semiconductor layer 42 is composed of, for example, n-type amorphous silicon, n-type amorphous silicon carbide, n-type amorphous silicon nitride, n-type amorphous silicon oxide, or n-type amorphous silicon nitride oxide. The n-type amorphous semiconductor layer 42 has a thickness of, for example, 5 to 30 nm.

The n-type amorphous semiconductor layer 42 may contain, for example, phosphorus (P) as a n-type impurity. The "n-type" semiconductor, throughout the embodiments of the present invention, has a n-type impurity concentration of at least $1\times10^{15}$ atoms/cm$^3$.

The electrodes 5 are disposed on the first amorphous semiconductor layer 3. Each electrode 5 includes a different one of electrodes 50 that are mutually separated in the length direction (x-axis direction). The electrodes 50 are arranged at prescribed intervals.

The electrode 5 includes conductive layers 51 and 52. The conductive layer 51 is disposed in contact with the first amorphous semiconductor layer 3. The conductive layer 51 is composed of, for example, silver. The conductive layer 51 has a thickness of, for example, 50 to 300 nm.

The conductive layer 52 is disposed on the conductive layer 51 in contact with the conductive layer 51. The conductive layer 52 is composed of an electrochemically stable metal that is likely to form a good oxide coating. The conductive layer 52 is preferably composed of a metal that is more likely to be oxidized than silver, a metal that is more likely to be oxidized than wires 82 and 83, or a metal that has a higher hardness than the wires 82 and 83. The conductive layer 52 is composed of, for example, copper, nickel, aluminum, molybdenum, titanium, or an alloy of some or all of these metals. Among these examples, copper, nickel, and nickel alloys are preferred examples of material for the conductive layer 52. The conductive layer 52 has a thickness of, for example, 100 nm to 500 nm.

The electrodes 5 may be interconnected in the length direction (x-axis direction).

The electrodes 6 are disposed on the second amorphous semiconductor layer 4. Each electrode 6 includes a different one of electrodes 60 that are mutually separated in the length direction (x-direction). The electrodes 60 are arranged at prescribed intervals.

The electrode 6 includes conductive layers 61 and 62. The conductive layer 61 is disposed in contact with the second amorphous semiconductor layer 4. The conductive layer 61 is composed of the same material as the conductive layer 51 and has the same thickness as the conductive layer 51.

The conductive layer 62 is disposed on the conductive layer 61 in contact with the conductive layer 61. The conductive layer 62 is composed of the same material as the conductive layer 52 and has the same thickness as the conductive layer 52.

The electrodes 6 may be interconnected in the length direction (x-axis direction).

The conductive adhesive layer 7 is disposed between the conductive layer 52 in the electrodes 5 and the wire 82 on the wiring board 8 in contact with the conductive layer 52 and the wire 82 (see FIG. 2). The conductive adhesive layer 7 is disposed also between the conductive layer 62 in the electrodes 6 and the wire 83 on the wiring board 8 in contact with the conductive layer 62 and the wire 83 (see FIG. 3). The conductive adhesive layer 7 is composed of, for example, a low-melting-point solder, a conductive adhesive, or a conductive paste. The conductive adhesive layer 7 mechanically, as well as electrically, connects the conductive layers 52 and 62 in the electrodes 5 and 6 to the wires 82 and 83 on the wiring board 8.

The wiring board 8 includes an insulating substrate 81 and the wires 82 and 83. The wires 82 and 83 are disposed on the insulating substrate 81. The wires 82 and 83 are each shaped like a comb in a plan view (see FIG. 1).

The insulating adhesive layer 9 surrounds the electrodes 5 and 6.

FIG. 2 shows the wire 82 being connected electrically to the electrodes 5 (conductive layer 52) by the conductive adhesive layer 7 and the wire 83 facing the electrodes 6. FIG. 3 shows the wire 83 being connected electrically to the electrodes 6 (conductive layer 62) by the conductive adhesive layer 7 and the wire 82 facing the electrodes 5. There are empty spaces on the electrodes 5 and 6 where there is neither the insulating adhesive layer 9 nor the conductive adhesive layer 7.

The wire 82, if connected electrically to the electrodes 5 by the conductive adhesive layer 7, is connected to each electrode 5 (each electrode 50), for example, at two locations by the conductive adhesive layer 7 (see FIG. 1). The wire 83, if connected electrically to the electrodes 6 by the conductive adhesive layer 7, is connected to each electrode 6 (each electrode 60), for example, at two locations by the conductive adhesive layer 7 (see FIGS. 1 and 4).

The insulating substrate 81 is composed of an insulating material such as a film of polyester, polyethylene naphthalate, or polyimide.

Both the wires 82 and 83 are composed of a conductive material such as a stack of aluminum, copper, silver, tin, and zinc.

Figure 5:
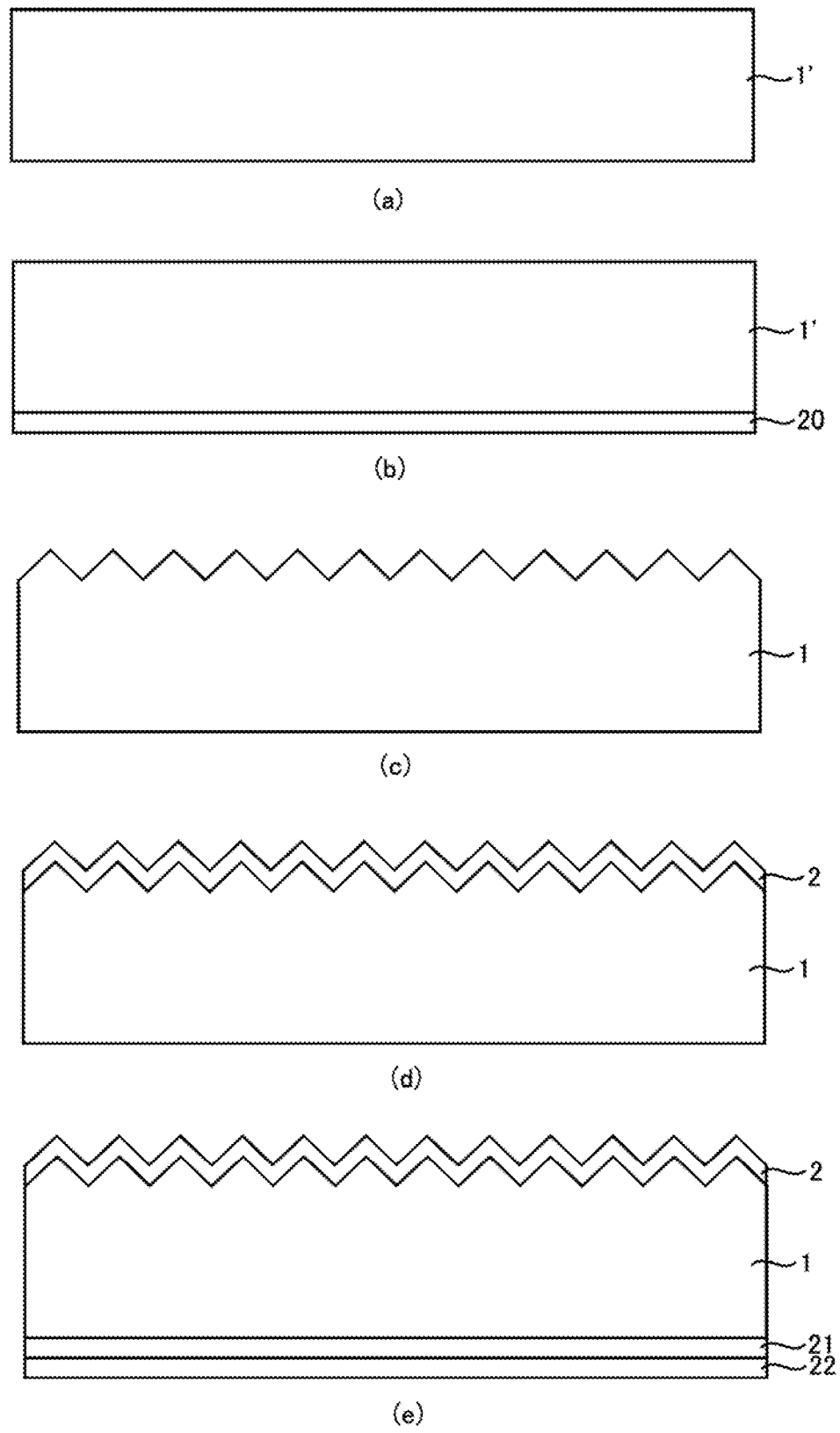
FIG. 5 is a first manufacturing process diagram illustrating manufacturing steps of the photovoltaic device shown in FIGS. 1 to 4.
Figure 6:
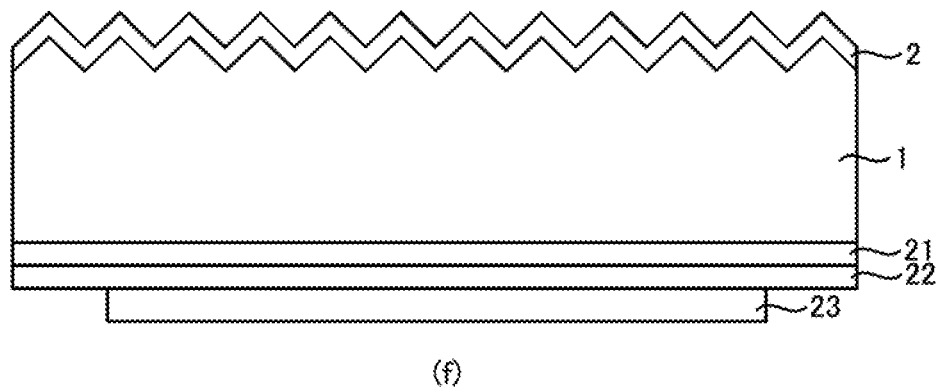
FIG. 6 is a second manufacturing process diagram illustrating manufacturing steps of the photovoltaic device shown in FIGS. 1 to 4.
Figure 6:
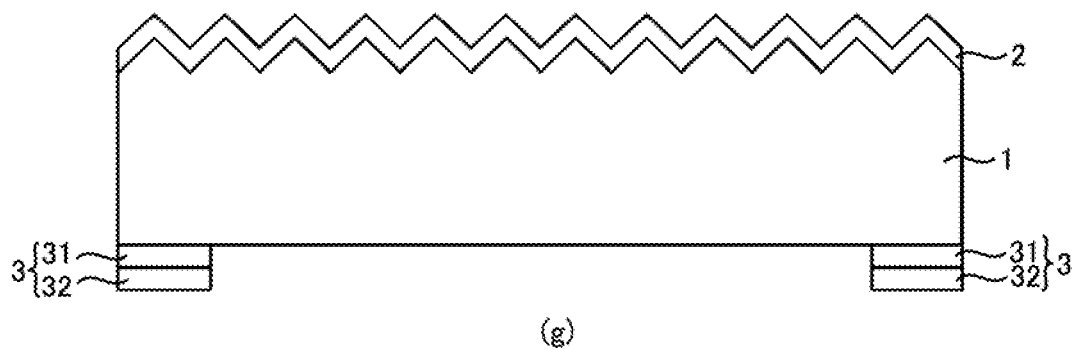
Figure 6:
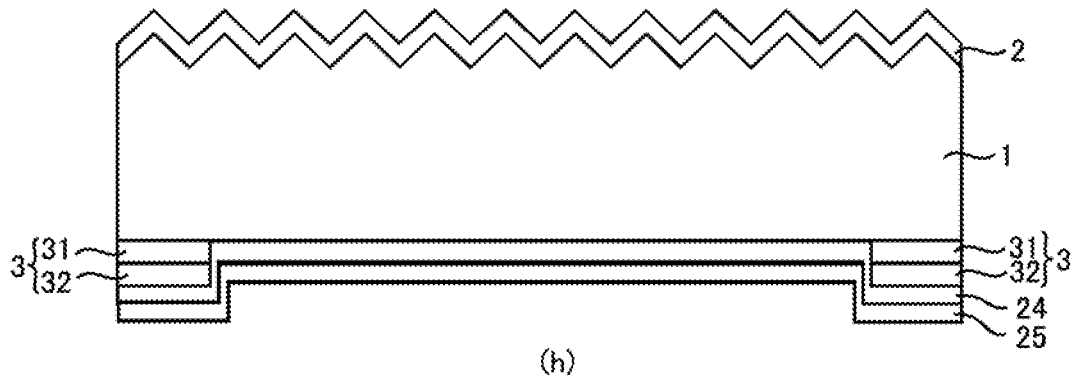
Figure 6:
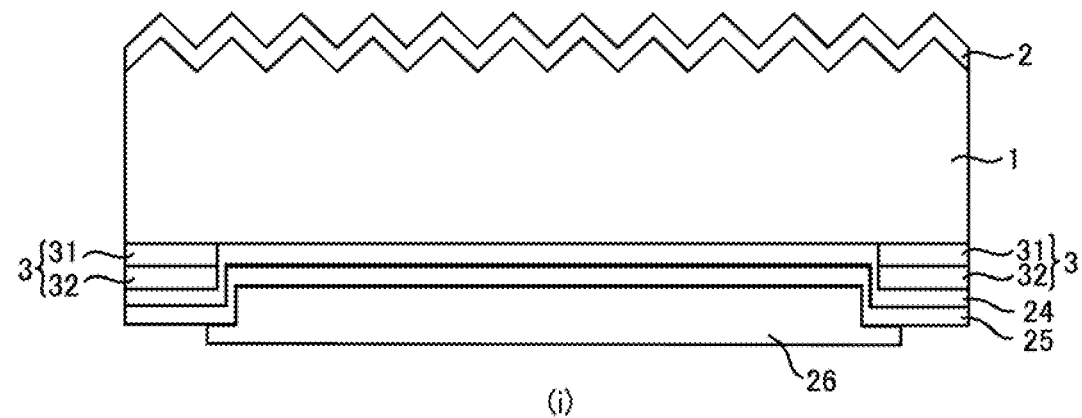
Figure 7:
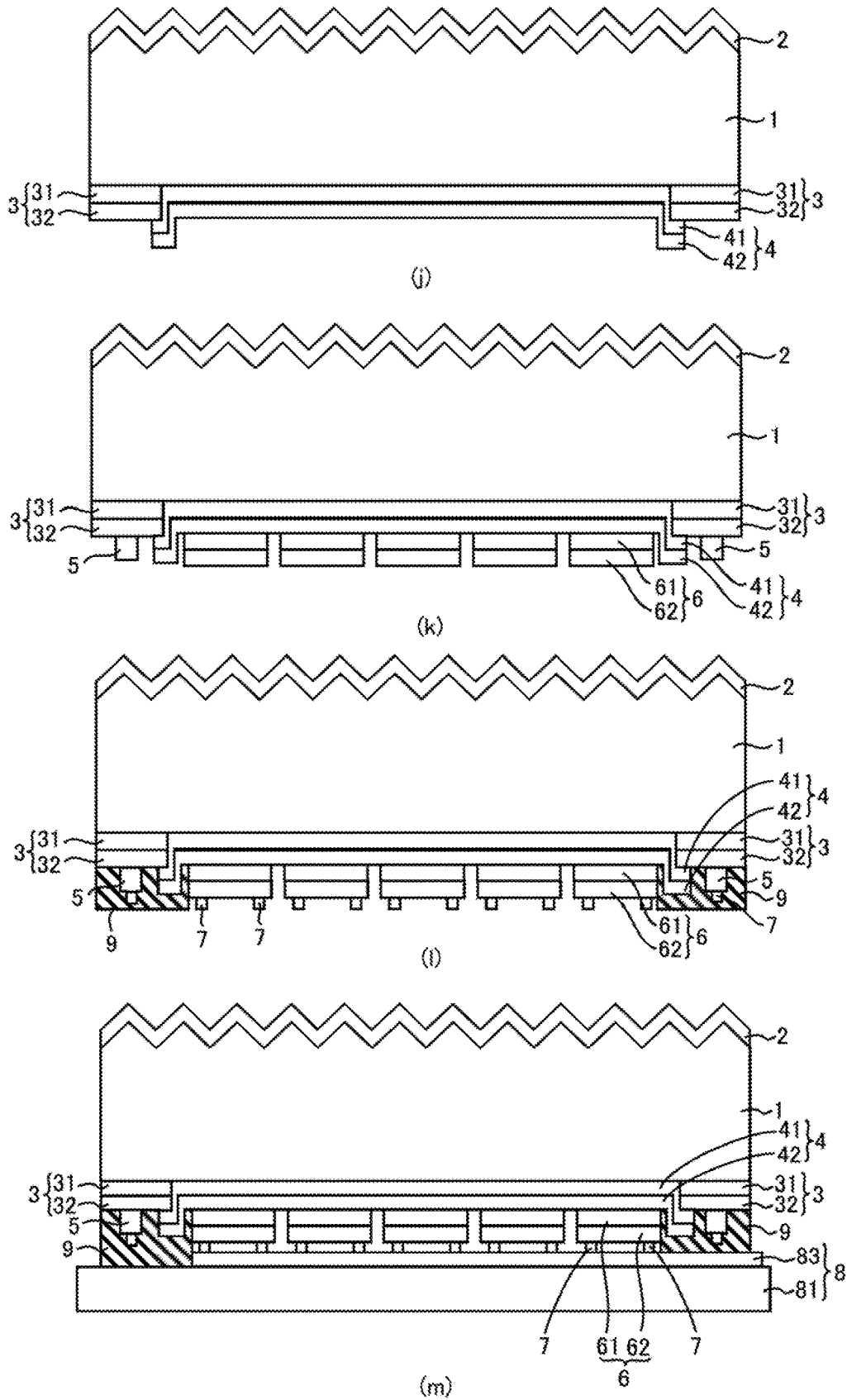
FIG. 7 is a third manufacturing process diagram illustrating manufacturing steps of the photovoltaic device shown in FIGS. 1 to 4.

FIGS. 5 to 7 are first to third manufacturing process diagrams respectively, illustrating manufacturing steps of the photovoltaic device 10 shown in FIGS. 1 to 4. The manufacturing process diagrams in FIGS. 5 to 7 correspond to a cross-sectional view taken along line IV-IV shown in FIG. 1.

Referring to FIG. 5, a semiconductor substrate 1' is prepared upon starting the manufacture of the photovoltaic device 10 (step (a) in FIG. 5). The semiconductor substrate 1' has the same crystal orientation, specific resistance, conductivity type, and thickness as the semiconductor substrate 1.

A protective film 20 is then formed on one of the faces of the semiconductor substrate 1' (step (b) in FIG. 5). The protective film 20 is composed of, for example, silicon oxide and silicon nitride and formed by, for example, sputtering.

Thereafter, the semiconductor substrate 1' on which the protective film 20 has been formed is etched in an alkaline solution of, for example, NaOH or KOH (e.g., an aqueous solution of KOH (1 to 5 wt %) and isopropyl alcohol (1 to 10 wt %)). This technique anisotropically etches a surface of the semiconductor substrate 1' that is opposite the face thereof carrying the protective film 20 thereon, thereby forming a pyramidal texture on that surface. The protective film 20 is then removed to obtain the semiconductor substrate 1 (see step (c) in FIG. 5).

Subsequently, the antireflective film 2 is formed on the surface of the semiconductor substrate 1 on which the texture has been formed (step (d) in FIG. 5). More specifically, the antireflective film 2 is formed, for example, by sequentially depositing silicon oxide and silicon nitride on the semiconductor substrate 1 by sputtering.

Following step (d), an i-type amorphous semiconductor layer 21 and a p-type amorphous semiconductor layer 22 are sequentially formed on a surface of the semiconductor substrate 1 that is opposite the face thereof carrying the texture thereon (step (e) in FIG. 5). The i-type amorphous semiconductor layer 21 and the p-type amorphous semiconductor layer 22 may be formed by plasma CVD (chemical vapor deposition) or any other method.

Conditions are publicly known for forming the i-type amorphous semiconductor layer 21 by plasma CVD from, for example, i-type amorphous silicon, i-type amorphous silicon carbide, i-type amorphous silicon nitride, i-type amorphous silicon oxide, or i-type amorphous silicon nitride oxide. These publicly known conditions may be used to form the i-type amorphous semiconductor layer 21.

Conditions are publicly known for forming the p-type amorphous semiconductor layer 22 by plasma CVD from, for example, p-type amorphous silicon, p-type amorphous silicon carbide, p-type amorphous silicon nitride, p-type amorphous silicon oxide, or p-type amorphous silicon nitride oxide. These publicly known conditions may be used to form the p-type amorphous semiconductor layer 22.

Subsequently to step (e), an etching paste 23 is applied on the p-type amorphous semiconductor layer 22 (step (f) in FIG. 6). The etching paste 23 may be of any material so long as the etching paste 23 allows etching of the stack of the i-type amorphous semiconductor layer 21 and the p-type amorphous semiconductor layer 22.

Next, the stack of the i-type amorphous semiconductor layer 21 and the p-type amorphous semiconductor layer 22 is partly etched out in the thickness direction by heating the etching paste 23 (step (g) in FIG. 6). This etching exposes parts of the back face of the semiconductor substrate 1 (surface of the semiconductor substrate 1 that is opposite the face thereof carrying the texture thereon). The etching also forms the first amorphous semiconductor layer 3 including the i-type amorphous semiconductor layer 31 and the p-type amorphous semiconductor layer 32.

An i-type amorphous semiconductor layer 24 is then formed so as to come into contact with the p-type amorphous semiconductor layer 32 and the exposed parts of the back face of the semiconductor substrate 1. Thereafter, a n-type amorphous semiconductor layer 25 is formed so as to come into contact with the entire surface of the i-type amorphous semiconductor layer 24 (step (h) in FIG. 6). The i-type amorphous semiconductor layer 24 and the n-type amorphous semiconductor layer 25 may be formed, for example, by plasma CVD or any other method.

Conditions are publicly known for forming the i-type amorphous semiconductor layer 24 by plasma CVD from, for example, i-type amorphous silicon, i-type amorphous silicon carbide, i-type amorphous silicon nitride, i-type amorphous silicon oxide, or i-type amorphous silicon nitride oxide. These publicly known conditions may be used to form the i-type amorphous semiconductor layer 24.

Conditions are publicly known for forming the n-type amorphous semiconductor layer 25 by plasma CVD from, for example, n-type amorphous silicon, n-type amorphous silicon carbide, n-type amorphous silicon nitride, n-type amorphous silicon oxide, or n-type amorphous silicon nitride oxide. These publicly known conditions may be used to form the n-type amorphous semiconductor layer 25.

Subsequently to step (h), an etching mask 26 is provided on the n-type amorphous semiconductor layer 25 (step (i) in FIG. 6). The etching mask 26 may be of any material so long as the etching mask 26 can serve as a mask in etching the stack of the i-type amorphous semiconductor layer 24 and the n-type amorphous semiconductor layer 25.

Next, the stack of the i-type amorphous semiconductor layer 24 and the n-type amorphous semiconductor layer 25 is partly etched out in the thickness direction using the etching mask 26 as a mask. The etching mask 26 is then removed. This etching exposes parts of the surface of the p-type amorphous semiconductor layer 32 (step (j) in FIG. 7). The etching also forms the second amorphous semiconductor layer 4 including the i-type amorphous semiconductor layer 41 and the n-type amorphous semiconductor layer 42.

Then, the electrodes 5 are formed on the p-type amorphous semiconductor layer 32, and the electrodes 6 are formed on the n-type amorphous semiconductor layer 42 (step (k) in FIG. 7). The electrodes 5 and 6 may be formed by sputtering or vapor deposition using a metal or other mask. The metal mask has openings where electrodes are to be formed. The openings preferably have a rectangular or other simple shape because there are restraints on, for example, the opening/non-opening ratio, minimum opening width, and shape that the openings are allowed to have, in order to maintain the mechanical strength of the metal mask. The mechanical strength is easier to maintain if the openings are arranged in a pattern than if the openings are irregularly located.

The electrodes 5 can be formed by forming the conductive layers 51 and 52 continuously using a single metal mask, and the electrodes 6 can be formed by forming the conductive layers 61 and 62 continuously using a single metal mask. Alternatively, the electrodes 5 and 6 can be formed by, for example, forming the conductive layers 51 and 61 and the conductive layers 52 and 62 continuously in a vacuum in a single sputtering device. These techniques help reduce cost.

This combined use of a metal mask(s) and a sputtering device enables the formation of the conductive layers 52 and 62 such that the conductive layers 52 and 62 can practically cover the top faces of the conductive layers 51 and 61. The electrodes 5 and 6 formed in this manner may in some cases have a thickness that increases from the periphery toward the center, depending on the opening width and opening-forming conditions.

Following step (k), a low-melting-point solder paste is provided in the form of dots on the electrodes 5 and 6 by printing or a like technique in order to form the conductive adhesive layer 7. The insulating adhesive layer 9 is also formed by printing or a like technique so as to surround the electrodes 5 and 6 (step (1) in FIG. 7).

Next, the insulating substrate 81 is prepared, which is approximately 150 μm thick. The semiconductor substrate 1 and the wiring board 8 are attached together, with their positions adjusted in such a manner that the wires 82 and 83 are substantially parallel to the electrodes 5 and 6 respectively in order to establish electrical contacts in prescribed locations. Then, for example, pressure and heat are applied to the combined semiconductor substrate 1 and wiring board 8 from both sides thereof to electrically join them, which completes the manufacture of the photovoltaic device 10 (step (m) in FIG. 7).

In the photovoltaic device 10, the electrodes 5 have portions thereof connected to the wire 82 via the conductive adhesive layer 7 and the other portions thereof facing the wire 82. The electrodes 6 have portions thereof connected to the wire 83 via the conductive adhesive layer 7 and the other portions thereof facing the wire 83. The electrodes 5 and 6 are also partially connected to the wires 82 and 83 respectively via the conductive adhesive layer 7. This arrangement, where the electrodes 5 and 6 are connected to the wires 82 and 83 respectively with sufficient mechanical strength and connected partially to the wires 82 and 83, relieves the stress applied to the electrodes 5 and 6.

The electrodes 5 and 6 are in contact with the p-type amorphous semiconductor layer 32 and the n-type amorphous semiconductor layer 42 respectively and include the conductive layers 51 and 61 composed primarily of silver. The electrodes 5 and 6 therefore have such a high reflectance as to reflect the light having been transmitted, without being absorbed, by the semiconductor substrate 1, the p-type amorphous semiconductor layer 32, and the n-type amorphous semiconductor layer 42, back toward the light-incident side of the semiconductor substrate 1, which increases short-circuit photocurrent.

Additionally, the conductive layers 51 and 61, composed primarily of silver, can form relatively good electrical contacts with the p-type amorphous semiconductor layer 32 and the n-type amorphous semiconductor layer 42 respectively.

In addition, since the electrodes 5 and 6 include the conductive layers 52 and 62 covering the conductive layers 51 and 61 respectively, the surfaces of the conductive layers 52 and 62 are oxidized before the surfaces of the conductive layers 51 and 61 respectively. A thin film of oxide, formed on the surfaces of the conductive layers 52 and 62, reduces oxygen penetration, thereby preventing oxygen from reaching the conductive layers 51 and 61 (which are composed of silver). This mechanism restrains oxidation of the p-type amorphous semiconductor layer 32 and the n-type amorphous semiconductor layer 42 and hence restrains detachment of the electrodes 5 and 6.

These various factors restrain degradation of characteristics of the photovoltaic device 10 including electrodes composed primarily of silver.

The characteristics of the conventional photovoltaic device including electrodes composed primarily of silver may be degraded for the following reasons if the device is left in the air. Silver is so hard to be oxidized that oxygen can pass through silver, thereby reaching and oxidizing the p-type amorphous semiconductor layer and/or the n-type amorphous semiconductor layer. Furthermore, the oxidized interface formed in this manner could decrease adhesive strength at the interface.

Electrodes in solar cells can come off for those reasons if the device is left in the air. It has been found that influences could show especially in a heterojunction back-contact solar cell with a wiring board because electrodes can be made with a reduced thickness if the electrodes are composed of solid silver material. "Solid" here refers to a condition where the density of the substance constituting an electrode is at least 95% the density of the constituting metal. For instance, an electrode of silver (density: 10.49 g/cm$^3$) is "solid" if the electrode has a density of at least 9.97 g/cm$^3$.

Silver has such a high electrical conductivity that electrodes, if composed primarily of silver, can be reduced in thickness. A reduced thickness of an electrode however allows oxygen to reach interfaces between the electrodes and the p- and n-type amorphous semiconductor layers 32 and 42, which oxidizes the p-type amorphous semiconductor layer 32 and the n-type amorphous semiconductor layer 42.

In contrast, in the photovoltaic device 10, the conductive layers 51 and 61 are covered respectively by the conductive layers 52 and 62 as mentioned earlier. This arrangement makes it difficult for oxygen to penetrate into the conductive layers 51 and 61 and hence restrains oxidation of the p-type amorphous semiconductor layer 32 and the n-type amorphous semiconductor layer 42.

The structure detailed above of the photovoltaic device 10 is therefore suitable for a heterojunction back-contact solar cell with a wiring board.

The conductive adhesive layer 7 may penetrate into electrodes depending on the composition of the electrodes because the electrodes, wires, and adhesive layer are prepared and joined. The conductive adhesive layer 7 could thus have voids in some portions thereof, allowing an increased amount of oxygen to penetrate in the vicinity of the conductive adhesive layer. Oxygen penetration is particularly evident if the electrodes have voids and are not solid.

Therefore, by fabricating suitable adhesive layers, the conductive layers 52 and 62 of the photovoltaic device 10 can be connected well to the conductive adhesive layer 7, reduce penetration of the conductive adhesive layer 7, prevent diffusion of the conductive adhesive layer 7 into silver, prevent increases of voids in the vicinity of the conductive adhesive layer 7, and prevent oxygen penetration.

Stress is applied, and electric current is concentrated, in the vicinity of the conductive adhesive layer. Therefore, there may occur, in the vicinity of the conductive adhesive layer after an environmental test, defects that appear to be detachment from the interface between the conductive amorphous semiconductor layer and silver and electrical property flaws that appear to be failed junctions between the conductive amorphous semiconductor layer and electrodes. The use of the conductive layers 52 and 62 however restrains detachment of the electrodes 5 and 6 in the vicinity of the conductive adhesive layer 7 and reduces failed junctions between the p- and n-type amorphous semiconductor layers 32 and 42 and the electrodes 5 and 6. That in turn improves the characteristics, and hence the reliability, of the photovoltaic device 10.

The conductive layers 52 and 62 face the wires 82 and 83 respectively at locations where the conductive adhesive layer 7 provides no adhesion. The surfaces of the conductive layers 52 and 62 are directly exposed to an oxygen-containing atmosphere. These arrangements form a finer oxide film on the conductive layers 52 and 62, reduce oxygen penetration, and prevent penetration of oxygen into silver.

Silver could be sulfurized at these locations unless the surface is covered by the conductive layers 52 and 62, which could lead to poor reliability. For instance, in a non-solid structure such as silver paste electrodes, because fabrication is done by printing, the electrodes are relatively thick, and influences are hardly observed at silver surfaces. On the other hand, electrodes that are fabricated by, for example, sputtering, vapor deposition, or plating have low resistance despite their reduced thickness because they are solid. Such electrodes are also prone to influences of sulfurization of the surfaces because they are fabricated with a reduced thickness.

In addition, conventionally, the opposing face between electrodes and wires is mostly connected by the conductive adhesive layer, and there have been no particular problems. However, there exists a mixed combination of portions where electrodes and wires are adhered by the conductive adhesive layer and portions where electrodes and wires are not adhered by the conductive adhesive layer. For this reason, chemical reactions may proceed electrochemically. Reliability may be therefore affected depending on the substances of the electrodes, the wires, and the conductive adhesive layer.

If the conductive layers 52 and 62 cover the conductive layers 51 and 61 respectively, a finer oxide film can be formed, which will restrain electrochemical reactions and improve reliability.

The conductive layers 52 and 62 are composed of a metal that is likely to be oxidized than the wires 82 and 83 respectively. This arrangement prevents the wires 82 and 83 from being oxidized before the conductive layers 52 and 62, thereby forming good electrical connections. Chemical reactions may proceed electrochemically if there exists a mixed combination of portions where the electrodes 5 and 6 are connected to the wires 82 and 83 by the conductive adhesive layer 7 and portions where the electrodes 5 and 6 are not adhered to the wires 82 and 83 by the conductive adhesive layer 7. The arrangement where the conductive layers 52 and 62 are composed of a metal that is likely to be oxidized than the wires 82 and 83 respectively is therefore desirable.

Furthermore, the conductive layers 52 and 62 are composed of a metal that has a higher hardness than the wires 82 and 83 respectively. This arrangement prevents scratches. Scratches on the conductive layers 52 and 62 due to the contact of the electrodes 5 and 6 and the wires 82 and 83 should be avoided in forming connections by means of the conductive adhesive layer 7 because such scratches could allow oxygen to penetrate into the conductive layers 51 and 61 (which are composed of silver).

If the electrodes 5 and 6 are partially connected electrically to the wires 82 and 83 via the conductive adhesive layer 7, the electrodes 5 and 6 are often in direct contact with the wires 82 and 83 during and after manufacture. The arrangement where the conductive layers 52 and 62 are composed of a metal that has a higher hardness than the wires 82 and 83 respectively is desirable.

The semiconductor substrate 1 has been so far described as being built around a n-type monocrystalline silicon substrate. Embodiment 1 is however not limited to this example. Alternatively, the semiconductor substrate 1 may be built around any of a n-type polycrystalline silicon substrate, a p-type monocrystalline silicon substrate, and a p-type polycrystalline silicon substrate.

If the semiconductor substrate 1 is built around a p-type monocrystalline silicon substrate or a p-type polycrystalline silicon substrate, the first amorphous semiconductor layer 3 and the second amorphous semiconductor layer 4 simply need to be exchanged in the description above.

PCT International Application Publication No. WO2015/060432 discloses an electrode including a first conductive layer and a second conductive layer. The first conductive layer contains a first metal as a primary component, whereas the second conductive layer contains a second metal. The second metal is more likely to be oxidized than the first metal (see paragraph 0009 of PCT International Application Publication No. WO2015/060432). In PCT International Application Publication No. WO2015/060432, the first conductive layer corresponds to a conductive layer 26n shown in FIG. 1, whereas the second conductive layer corresponds to a conductive layer 28n shown in FIG. 1. FIG. 1 of PCT International Application Publication No. WO2015/060432 shows the conductive layer 28n being disposed in contact with a n-type amorphous silicon layer 20n and the conductive layer 26n being disposed in contact with the conductive layer 28n. In other words, PCT International Application Publication No. WO2015/060432 discloses a structure where the conductive layer 28n, which is composed of a metal that is more likely to be oxidized, is disposed in contact with the n-type amorphous silicon layer 20n. Therefore, there is formed an oxide film at the interface between the n-type amorphous silicon layer 20n and the conductive layer 28n, and the n-type amorphous silicon layer 20n is oxidized, in PCT International Application Publication No. WO2015/060432. As a result, the structure disclosed in PCT International Application Publication No. WO2015/060432 does not deliver the advantages of the photovoltaic device 10, falling short of giving a solution to the electrode detachment problem.

Therefore, the photovoltaic device 10 has a structure that is totally different from the structure disclosed in PCT International Application Publication No. WO2015/060432. Additionally, PCT International Application Publication No. WO2015/060432 fails to suggest the structure of the photovoltaic device 10. It is therefore difficult for a person skilled in the art to easily conceive the structure of the photovoltaic device 10 on the basis of PCT International Application Publication No. WO2015/060432.

Embodiment 2

Figure 8:
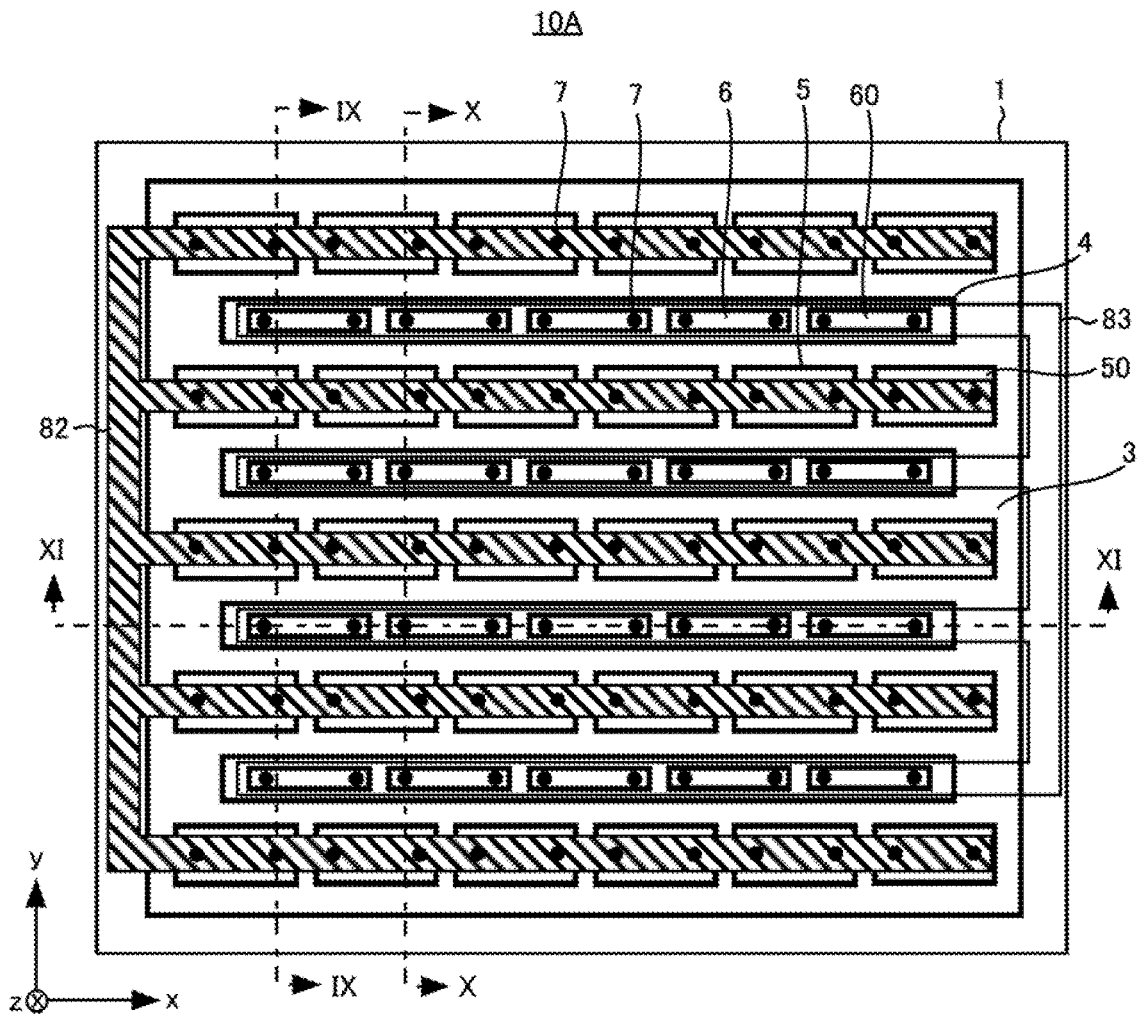
FIG. 8 is a plan view of a photovoltaic device in accordance with Embodiment 2.
Figure 9:
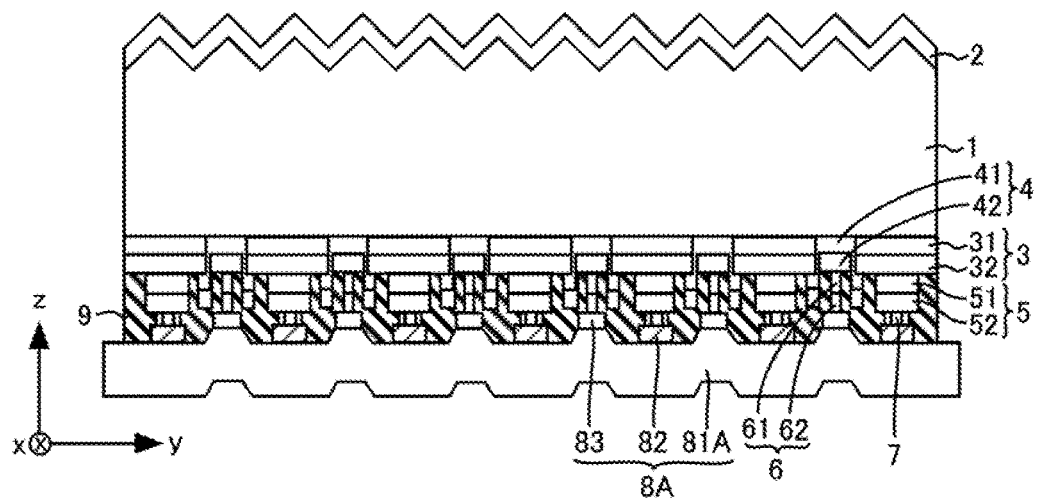
FIG. 9 is a cross-sectional view of the photovoltaic device shown in FIG. 8 taken along line IX-IX.
Figure 10:
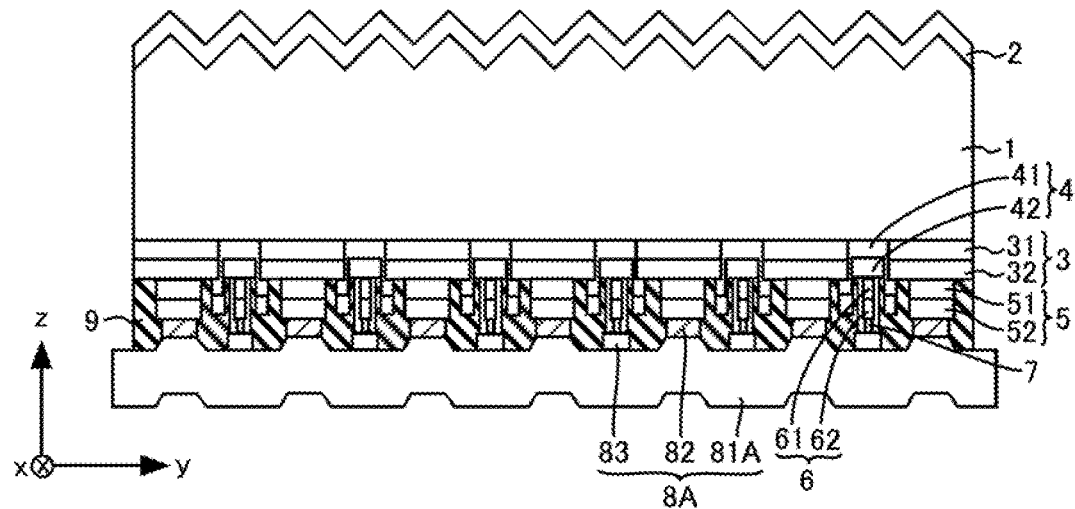
FIG. 10 is a cross-sectional view of the photovoltaic device shown in FIG. 8 taken along line X-X.
Figure 11:
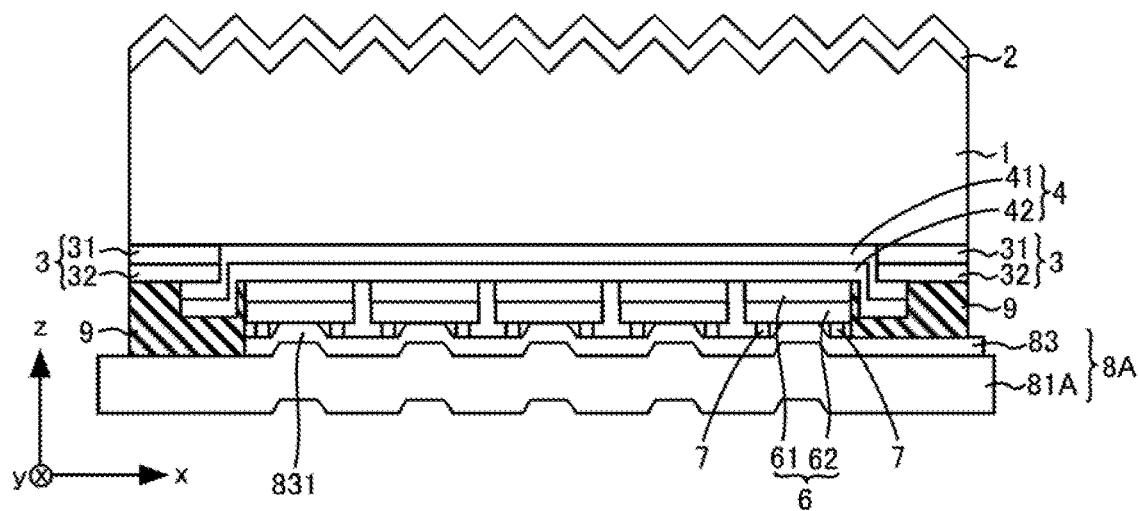
FIG. 11 is a cross-sectional view of the photovoltaic device shown in FIG. 8 taken along line XI-XI.

FIG. 8 is a plan view of a photovoltaic device in accordance with Embodiment 2. FIG. 9 is a cross-sectional view of the photovoltaic device shown in FIG. 8 taken along line IX-IX. FIG. 10 is a cross-sectional view of the photovoltaic device shown in FIG. 8 taken along line X-X. FIG. 11 is a cross-sectional view of the photovoltaic device shown in FIG. 8 taken along line XI-XI. Note that FIG. 8 shows the photovoltaic device as it is viewed from a side opposite a light-incident side.

Referring to FIGS. 8 to 11, a photovoltaic device 10A in accordance with Embodiment 2 includes a wiring board 8A in place of the wiring board 8 of the photovoltaic device 10 shown in FIGS. 1 to 4 and otherwise has the same structure as the photovoltaic device 10.

The plan view of the photovoltaic device 10A shown in FIG. 8 is the same as the plan view of the photovoltaic device 10 shown in FIG. 1.

Referring to FIGS. 9 to 11, the wiring board 8A includes an insulating substrate 81A in place of the insulating substrate 81 for the wiring board 8 shown in FIGS. 2 to 4 and otherwise has the same structure as the wiring board 8.

The insulating substrate 81A is composed of the same material as the insulating substrate 81. The insulating substrate 81A, having a thickness of, for example, 50 µm, is thinner than the insulating substrate 81.

Referring to FIG. 9, the electrodes 5 are connected to the wire 82 by the conductive adhesive layer 7.

Meanwhile, the electrodes 6 are in contact with the wire 83. As a result, the electrodes 6 are connected electrically, but not mechanically, to the wire 83. Therefore, the surface of the conductive layer 62 in the electrodes 6 is oxidized by oxygen if the photovoltaic device 10A is left in the air.

The insulating substrate 81A is so thin that the portion of the insulating substrate 81A where the wire 83 is provided is bent like being projected in the direction of the electrodes 6 under the pressure applied in attaching the semiconductor substrate 1 and the wiring board 8A together (see FIG. 9).

Referring to FIG. 10, the electrodes 5 are in contact with the wire 82. As a result, the electrodes 5 are connected electrically, but not mechanically, to the wire 82. Therefore, the surface of the conductive layer 52 in the electrodes 5 is oxidized by oxygen if the photovoltaic device 10A is left in the air.

Meanwhile, the electrodes 6 are connected to the wire 83 by the conductive adhesive layer 7.

The insulating substrate 81A is so thin that the portion of the insulating substrate 81A where the wire 82 is provided is bent like being projected in the direction of the electrodes 5 under the pressure applied in attaching the semiconductor substrate 1 and the wiring board 8A together (see FIG. 10).

Referring to FIG. 11, each electrode 6 is connected at two locations to the wire 83 by the conductive adhesive layer 7 and has such a portion where there exists no conductive adhesive layer 7 and the electrode 6 is in contact with a protrusion 831 of the wire 83. The protrusion 831 projects in the direction of the electrode 6. As a result, the electrodes 6 are connected electrically and mechanically to the wire 83 by the conductive adhesive layer 7 and connected electrically, but not mechanically, to the respective protrusions 831 of the wire 83. Therefore, the surface of those portions of the conductive layer 62 in the electrodes 6 which are in contact with the protrusions 831 of the wire 83 is oxidized by oxygen if the photovoltaic device 10A is left in the air.

In a cross-sectional view, taken parallel to the x-axis direction, of portions of the photovoltaic device 10A where the electrodes 5 are provided, each electrode 5 is connected at two locations to the wire 82 by the conductive adhesive layer 7 and has such a portion where there exists no conductive adhesive layer 7 and the electrode 5 is in contact with a protrusion of the wire 82. The protrusion of the wire 82 projects in the direction of the electrode 5. As a result, the electrodes 5 are connected electrically and mechanically to the wire 82 by the conductive adhesive layer 7 and connected electrically, but not mechanically, to the respective protrusions of the wire 82. Therefore, the surface of those portions of the conductive layer 62 in the electrodes 5 which are in contact with the protrusions of the wire 82 is oxidized by oxygen if the photovoltaic device 10A is left in the air.

The photovoltaic device 10A is manufactured by steps (a) to (m) illustrated in FIGS. 5 to 7. Attaching the semiconductor substrate 1 and the wiring board 8A together in the manufacturing process causes portions of the insulating substrate 81A to project toward the electrodes 5 and 6 and portions of the wires 82 and 83 to project toward the electrodes 5 and 6 respectively. As a result, the photovoltaic device 10A comes to have a cross-sectional structure shown in the cross-sectional views in FIGS. 9 to 11.

In the photovoltaic device 10A, the electrodes 5 and 6 are connected to the wires 82 and 83 respectively by the conductive adhesive layer 7 and have such portions where there exists no conductive adhesive layer 7 and the electrodes 5 and 6 are in contact with the wires 82 and 83 respectively.

Therefore, the electrodes 5 and 6 in the photovoltaic device 10A have larger portions thereof being connected electrically to the wires 82 and 83 than the electrodes 5 and 6 in the photovoltaic device 10. That can in turn improve the characteristics of the photovoltaic device 10A.

The description of Embodiment 1 applies to Embodiment 2 unless otherwise mentioned explicitly.

Embodiment 3

Figure 12:
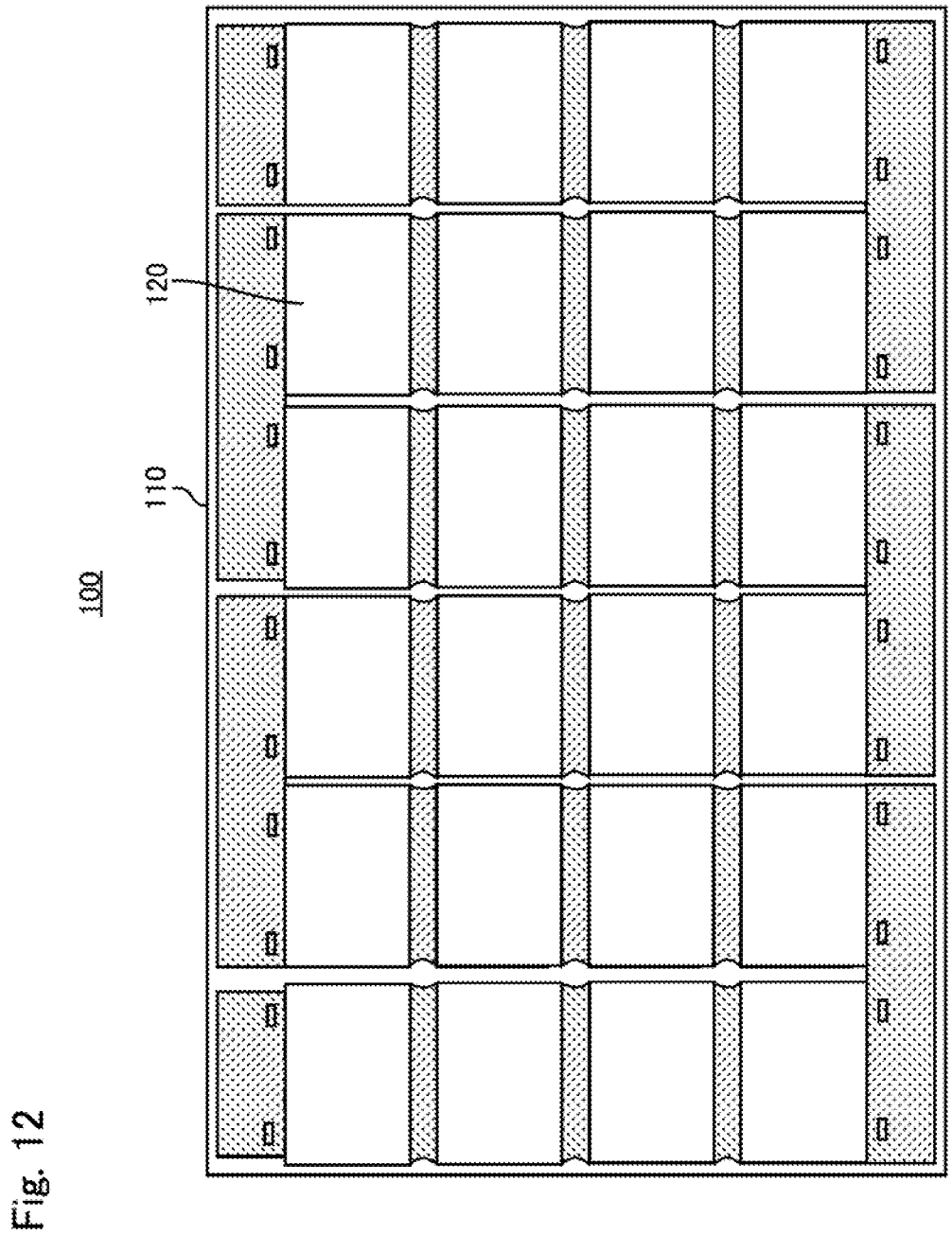
FIG. 12 is a plan view of a solar cell module in accordance with Embodiment 3.

FIG. 12 is a plan view of a solar cell module in accordance with Embodiment 3. FIG. 12 shows the solar cell module as it is viewed from a light-incident side.

Referring to FIG. 12, a solar cell module 100 in accordance with Embodiment 3 includes a wiring board 110 and a plurality of solar cells 120.

The solar cells 120 are arranged on the wiring board 110, for example, in a 4×6 matrix and electrically connected, for example, in series.

Each solar cell 120 includes, among members of the aforementioned photovoltaic device 10 or 10A, the semiconductor substrate 1, the antireflective film 2, the first amorphous semiconductor layer 3, the second amorphous semiconductor layer 4, and the electrodes 5 and 6.

Figure 13:
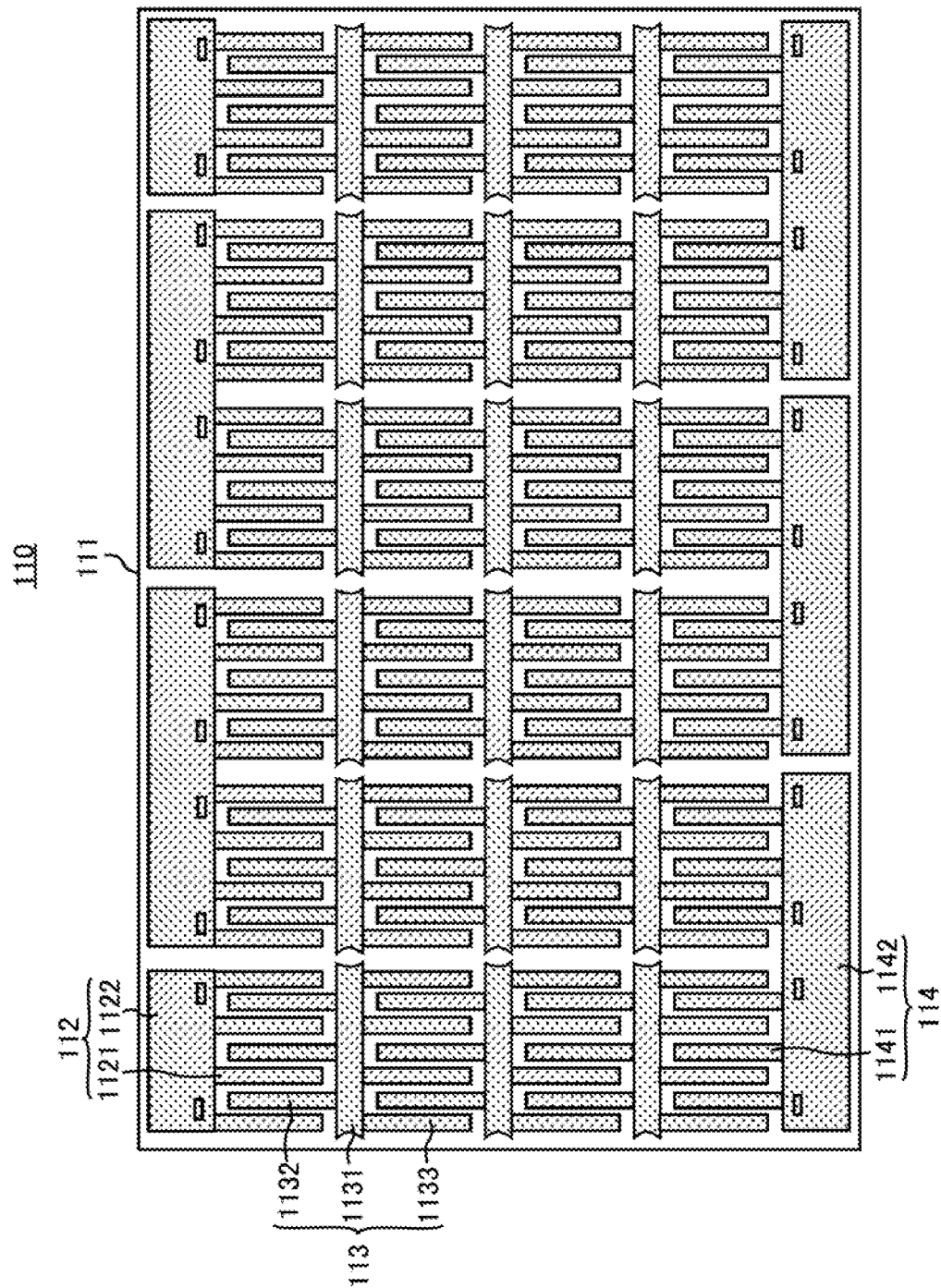
FIG. 13 is a plan view of a wiring board shown in FIG. 12.

FIG. 13 is a plan view of the wiring board 110 shown in FIG. 12. Referring to FIG. 13, the wiring board 110 includes an insulating substrate 111 and wires 112 to 114.

The insulating substrate 111 may be made of any insulating base material such as a film of polyester, polyethylene naphthalate, or polyimide. The insulating substrate 111 has the same thickness as the insulating substrate 81 or the insulating substrate 81A.

Each wire 112 includes a plurality of wires 1121 and a wire 1122. The wires 1121 are arranged parallel to each other so that each wire 1121 has an end connected to the wire 1122. The wires 1121 project in a single direction from the wire 1122.

Each wire 113 includes a wire 1131, a plurality of wires 1132, and a plurality of wires 1133. The wires 1132 are arranged parallel to each other. The wires 1133 are also arranged parallel to each other.

Each wire 1132 has an end connected to the wire 1131. The wires 1132 project in a single direction from the wire 1131.

Each wire 1133 has an end connected to the wire 1131. The wires 1133 project from the wires 1131 in a direction opposite the direction in which the wires 1132 project.

Each wire 114 includes a plurality of wires 1141 and a wire 1142. The wires 1141 are arranged parallel to each other so that each wire 1141 has an end connected to the wire 1142. The wires 1141 project in a single direction from the wires 1142.

The wiring board 110 includes two wires 112, eighteen wires 113, and five wires 114 on the insulating substrate 111. In this example, the wires 1121 of the wires 112 are arranged to alternate with the wires 1132 of the wires 113 between the wires 112 and 113. Between two adjacent wires 113, the wires 1132 of one of the wires 113 are arranged to alternate with the wires 1133 of the other wire 113. The wires 1132 or 1133 of the wires 113 are arranged to alternate with the wires 1141 of the wires 114 between the wires 113 and 114.

Arranging twenty-four solar cells 120 in a 4×6 matrix on the wiring board 110 as described here electrically connects the twenty-four solar cells 120 in series.

The wires 112 to 114 are composed of a conductive material such as copper, silver-plated copper, or tin-plated copper.

The wires 1131, 1132, 1133, and 1141 may be formed, for example, by providing a metal or like conductive film across the entire surface of an insulating base member 111 and then etching out or otherwise removing portions of the conductive film for patterning.

A string of back-contact solar cells each with a wiring board prepared in this manner is sealed with, for example, a resin by a conventionally known method to obtain the solar cell module 100.

A string of solar cells connected as described here is sandwiched between EVA (ethylene vinyl acetate) films serving as a sealant and then further sandwiched between a glass plate (surface-protection layer) and a back face film of, for example, an acrylic resin. The bubbles trapped between the EVA films are removed by depressurization (laminated). The EVA films are then heated (cured), so that the EVA can cure, which seals the back-contact solar cells. Thereafter, an aluminum frame is fitted along the outer circumference of the sealed string of solar cells, and a terminal box is connected to a pair of external terminals extending outwards. That completes the manufacture of the solar cell module 100.

Since each individual back-contact solar cell (solar cell 120) in the solar cell module 100 structured in this manner has improved characteristics, the solar cell module 100 has its characteristics synergistically improved. Furthermore, since the back-contact solar cells (solar cells 120) in the solar cell module 100 can be easily connected with each other, the solar cell module 100 is fabricated more easily and in a more reliable manner.

A description will now be given of examples of the invention.

Example 1

Photovoltaic devices were fabricated as Example 1 in accordance with Embodiment 1, and their characteristics were evaluated. Specifically, the photovoltaic devices were fabricated as in the following.

First, a 150-μm thick wafer was cut out from a 156-mm n-type bulk silicon. The wafer was then etched to remove damaged layers on the water surface and also to adjust the thickness of the wafer.

A protective film was formed on one of the faces of the etched wafer. The protective film was a silicon nitride film. The wafer on which a protective film had been formed was then wet-etched using an aqueous solution of KOH (1 to 5 wt %) and isopropyl alcohol (1 to 10 wt %). The protective film was removed after the wet etching.

Subsequently, an antireflective film 2 composed of a silicon oxide film and a silicon nitride film would be formed on the light-receiving face of the semiconductor substrate 1. A surface of the semiconductor substrate 1 was first subjected to thermal oxidation to form an oxide film on the light-receiving face of the substrate, and thereafter, a silicon nitride film was formed on the oxide film on the light-receiving face, so as to form the antireflective film 2.

Next, as an i-type amorphous semiconductor film 31, a 5-nm, hydrogen-containing, practically intrinsic amorphous silicon film was formed in a plasma CVD device under the following conditions. Silane gas and hydrogen gas were introduced as reactant gases into a reaction chamber of the plasma CVD device. The temperature of the semiconductor substrate 1 was 200° C., the flow rate of the hydrogen gas was 100 sccm, the flow rate of the silane ($SiH_4$) gas was 40 sccm, the pressure inside the reaction chamber was 100 Pa, and the high frequency (13.56 MHz) electric power density was 10 $mW/cm^2$.

Subsequently, a 10-nm p-type amorphous semiconductor film 32 was formed on the i-type amorphous semiconductor film 31.

The p-type amorphous semiconductor film 32 was formed by plasma CVD under the following conditions. Silane gas, hydrogen gas, and hydrogen-diluted diborane ($B_2H_6$) gas (diborane concentration was 2%) were introduced as reactant gases into a reaction chamber of the plasma CVD device. The flow rate of the hydrogen gas was 100 sccm, the flow rate of the silane gas was 40 sccm, the flow rate of the diborane gas was 40 sccm, the temperature of the semiconductor substrate 1 was 200° C., the pressure inside the reaction chamber was 100 Pa, and the high frequency electric power density was 10 $mW/cm^2$.

A commercially available etching paste 23 was applied onto the p-type amorphous semiconductor film 32 by screen printing. Next, the etching paste 23 was heated to 200° C. for 10 minutes. The stack of the i-type amorphous semiconductor film 31 and the p-type amorphous semiconductor film 32 was partly etched out in the thickness direction. The semiconductor substrate 1 was cleaned in an ultrasonic bath for 10 minutes to remove the etched silicon film and etching paste (solid solution). These procedures exposed portions of the back face of the semiconductor substrate 1 as shown in step (g) in FIG. 6.

Next, as an i-type amorphous semiconductor film 24, a 5-nm, hydrogen-containing, practically intrinsic amorphous silicon film was formed in a plasma CVD device under the following conditions. Silane gas and hydrogen gas were introduced as reactant gases into a reaction chamber of the plasma CVD device. The temperature of the semiconductor substrate 1 was 200° C., the flow rate of the hydrogen gas was 100 sccm, the flow rate of the silane ($SiH_4$) gas was 40 sccm, the pressure inside the reaction chamber was 100 Pa, and the high frequency (13.56 MHz) electric power density was 10 $mW/cm^2$.

Subsequently, a 10-nm n-type amorphous semiconductor film 25 was formed on the i-type amorphous semiconductor film 24.

The n-type amorphous semiconductor film 25 was formed by plasma CVD under the following conditions. Silane gas, hydrogen gas, and hydrogen-diluted phosphine ($PH_3$) gas (phosphine concentration was, for example, 1%) were introduced as reactant gases into a reaction chamber of the plasma CVD device. The temperature of the semiconductor substrate 1 was 170° C., the flow rate of the hydrogen gas was 100 sccm, the flow rate of the silane gas was 40 sccm, the flow rate of the phosphine gas was 40 sccm, the pressure inside the reaction chamber was 40 Pa, the high frequency (13.56 MHz) electric power density was 8.33 $mW/cm^2$.

Next, an etching mask 26 was formed on the n-type amorphous semiconductor film 25 as shown in step (i) in FIG. 6, by applying a commercially available photoresist by screen printing and thoroughly drying the applied photoresist. The semiconductor substrate 1 was then immersed in a 1% KOH solution using the etching mask 26 as a mask. The stack of the i-type amorphous semiconductor film 24 and the n-type amorphous semiconductor film 25 was partly etched out in the thickness direction. These procedures exposed portions of the stack of the i-type amorphous semiconductor film 24 and the n-type amorphous semiconductor film 25. Thereafter, the etching mask 26 was removed using an SPM cleaning solution.

After the formation of a n-type amorphous semiconductor film 42, the electrodes 5 and 6 were formed respectively on the p-type amorphous semiconductor film 32 and the n-type amorphous semiconductor film 42.

The electrodes 5 and 6 were formed by placing a single, common metal mask on the semiconductor substrate 1 and continuously forming 200-nm silver electrodes containing 0.5 wt % titanium as the conductive layers 51 and 61 and 300-nm nickel electrodes as the conductive layers 52 and 62, all by sputtering.

The metal mask had the following pattern. The electrodes 5 had a width of 900 µm. The electrodes 6 had a width of 200 µm and a repetition pitch of 1.5 mm. The electrodes 6 had an outer periphery with an end region located 1,000 µm inside an end region of the substrate. The electrodes 5 had an outer periphery with an end region located 500 µm inside an end region of the substrate. The non-opening portions had a width of 200 µm. The metal mask had a thickness specified at 200 µm in view of mechanical strength. Also in view of mechanical strength, the openings were divided approximately at every 10 mm in the length direction to provide for 200-µm non-openings.

Subsequently, as illustrated in step (1) in FIG. 7 where a commercially available low-melting-point solder paste composed primarily of bismuth and tin was disposed as a conductive adhesive 7 on the electrodes 5 and 6 by printing. The low-melting-point solder paste had a print pitch of approximately 1 mm and a spot size of 150 µm. Next, a commercially available insulating adhesive layer 9 was formed by printing around the electrodes 5 and 6.

Next, as shown in step (m) in FIG. 7, a wiring board 8 was prepared that included an approximately 150-µm insulating substrate 81 and 50-µm copper wires 82 and 83. The semiconductor substrate 1 and the wiring board 8 were attached together by making such settings as to place the electrodes 5 and 6 substantially parallel to the wires 82 and 83 and adjusting their positions such that electrical contacts could be formed at prescribed locations.

Next, the attached semiconductor substrate 1 and wiring board 8 were heated at 200° C. for 10 minutes under pressure applied thereto from both sides thereof, to form junctions electrically. Twenty heterojunction back-contact solar cells 120 with a wiring board were fabricated by the process described above.

Ten of the heterojunction back-contact solar cells 120 fabricated as in the foregoing were left in the air for 10 days. The semiconductor substrate 1 and the wiring board 8 were pulled lightly in such a direction as to separate the semiconductor substrate 1 and the wiring board 8, but no appreciable changes were observed.

The semiconductor substrates 1 of the other ten solar cells 120 were sandwiched between commercially available glass, a back sheet of PET resin, and EVA and laminated to prepare a module.

Example 2

Photovoltaic devices were fabricated as Example 2 in accordance with Embodiment 2, and their characteristics were evaluated.

As shown in step (m) in FIG. 7, a wiring board 8A was prepared that included an approximately 50-µm insulating substrate 81A and 50-µm copper wires 82 and 83. The semiconductor substrate 1 and the wiring board 8A were attached together by making such settings as to place the electrodes 5 and 6 substantially parallel to the wires 82 and 83 and adjusting their positions such that electrical contacts could be formed at prescribed locations.

Next, the attached semiconductor substrate 1 and wiring board 8A were heated at 190° C. for 12 minutes under pressure applied thereto from both sides thereof, to form junctions electrically. Twenty heterojunction back-contact solar cells 120 with a wiring board were fabricated by the process described above.

Ten of the heterojunction back-contact solar cells 120 fabricated as in the foregoing were left in the air for 10 days. The semiconductor substrate 1 and the wiring board 8A were pulled lightly in such a direction as to separate the semiconductor substrate 1 and the wiring board 8A, but no appreciable changes were observed.

The semiconductor substrates 1 of the other ten solar cells 120 were sandwiched between commercially available glass, a back sheet of PET resin, and EVA and laminated to prepare a module.

Otherwise, the photovoltaic devices were fabricated similarly to Example 1.

Example 3

Photovoltaic devices were fabricated as Example 3 in accordance with Embodiment 2, and their characteristics were evaluated.

The electrodes 5 and 6 were formed by placing a single, common metal mask on the semiconductor substrate 1 and continuously forming 200-nm silver electrodes containing 0.5 wt % titanium as the conductive layers 51 and 61 and 300-nm titanium electrodes as the conductive layers 52 and 62, all by sputtering.

Subsequently, as illustrated in step (1) in FIG. 7 where a commercially available silver paste was disposed as the conductive adhesive 7 on the electrodes 5 and 6 by printing. The silver paste had a print pitch of 1 mm and a spot size of 150 µm.

Next, the attached semiconductor substrate 1 and wiring board 8A were heated at 190° C. for 12 minutes under pressure applied thereto from both sides thereof, to form junctions electrically. Twenty heterojunction back-contact solar cells 120 with a wiring board were fabricated by the process described above.

Ten of the heterojunction back-contact solar cells 120 fabricated as in the foregoing were left in the air for 10 days. The semiconductor substrate 1 and the wiring board 8A were pulled lightly in such a direction as to separate the semiconductor substrate 1 and the wiring board 8A, and the conductive adhesive 7 came off in one of the ten heterojunction back-contact solar cells 120. This detachment would be a result of slightly low mechanical strength of the conductive layers 52 and 62 and the conductive adhesive layer 7.

The semiconductor substrates 1 of the other ten solar cells 120 were sandwiched between commercially available glass, a back sheet of PET resin, and EVA and laminated to prepare a module.

Otherwise, the photovoltaic devices were fabricated similarly to Example 2.

Comparative Example 1

Photovoltaic devices were fabricated as Comparative Example 1 without providing the conductive layers 52 and 62.

Ten of the heterojunction back-contact solar cells fabricated as in the foregoing were left in the air for 10 days. The semiconductor substrate 1 and the wiring board 8A were pulled lightly in such a direction as to separate the semiconductor substrate 1 and the wiring board 8A, and an electrode partially came off in one of the ten heterojunction back-contact solar cells.

The semiconductor substrates 1 of the other ten solar cells were sandwiched between commercially available glass, a back sheet of PET resin, and EVA and laminated to prepare a module. Otherwise, the photovoltaic devices were fabricated similarly to Example 1.

Comparative Example 2

Photovoltaic devices were fabricated as Comparative Example 2 in the same manner as Comparative Example 1, except that a 5-nm titanium layer was provided as an adhesive layer under the conductive layers 51 and 61.

Ten of the heterojunction back-contact solar cells fabricated as in the foregoing were left in the air for 10 days. The semiconductor substrate 1 and the wiring board 8A were pulled lightly in such a direction as to separate the semiconductor substrate 1 and the wiring board 8A, but no appreciable changes were observed.

The semiconductor substrates 1 of the other ten solar cells were sandwiched between commercially available glass, a back sheet of PET resin, and EVA and laminated to prepare a module. Otherwise, the photovoltaic devices were fabricated similarly to Example 1.

Comparative Example 3

Photovoltaic devices were fabricated as Comparative Example 3 by providing the conductive adhesive layer 7 in the form of lines such that the conductive adhesive layer 7 occupies at least approximately 80% in area of the overlapping parts of the opposing faces of the electrodes 5 and 6 and the wires 82 and 83 across the entire semiconductor substrate 1.

Otherwise, the photovoltaic devices were fabricated similarly to Example 1. The semiconductor substrate 1 was observed to have slightly warped in five often solar cells.

Ten of the heterojunction back-contact solar cells fabricated as in the foregoing were left in the air for 10 days. The semiconductor substrate 1 and the wiring board 8A were pulled lightly in such a direction as to separate the semiconductor substrate 1 and the wiring board 8A, and cracks occurred in one of the ten solar cells.

The semiconductor substrates 1 of the other ten solar cells were sandwiched between commercially available glass, a back sheet of PET resin, and EVA and laminated to prepare a module. Otherwise, the photovoltaic devices were fabricated similarly to Example 1.

The electrical characteristics of those ten solar cells which were left in the air were evaluated before and after they were left in the air. As to the ten solar cells that were fabricated into modules, their electrical characteristics were evaluated before and after an environmental test.

The conversion efficiency of each photovoltaic device fabricated was measured using a solar simulator, and their average values were calculated. The conversion efficiency, relative to that of Example 1, was 1.02 in Example 2, 0.99 in Example 3, 0.99 in Comparative Example 1, 0.93 in Comparative Example 2, and 1.00 in Comparative Example 3. These results show that Examples 1, 2, and 3 have a better initial conversion efficiency than Comparative Example 2.

The conversion efficiency after the solar cell was left in the air, relative to that of Example 1, was 1.02 in Example 2, 0.99 in Example 3, 0.91 in Comparative Example 1, 0.93 in Comparative Example 2, and 0.99 in Comparative Example 3.

These results show that Examples 1, 2, and 3 have a better conversion efficiency than Comparative Examples 1 and 2 after the solar cell was left in the air.

The fabricated modules were left at 85° C. and 85% humidity in a high-temperature, high-humidity bath for 1 month. The conversion efficiency was then measured again using a solar simulator. The conversion efficiency, relative to that of Example 1, was 1.01 in Example 2, 0.99 in Example 3, 0.90 in Comparative Example 1, 0.93 in Comparative Example 2, and 0.98 in Comparative Example 3. These results show that Examples 1, 2, 3 have a better conversion efficiency than Comparative Examples 1, 2, and 3.

Examples 1 and 2 cost 2% less than Comparative Example 3. Example 3 cost 1% more than Examples 1 and 2.

The embodiments and examples disclosed herein are for illustrative purposes only in every respect and provide no basis for restrictive interpretations. The scope of the present invention is defined only by the claims and never bound by the embodiments or examples. Those modifications and variations that may lead to equivalents of claimed elements are all included within the scope of the invention.

INDUSTRIAL APPLICABILITY

The present invention is applicable to photovoltaic devices and solar cell modules including photovoltaic devices.

The invention claimed is:
1. A photovoltaic device comprising:
a semiconductor substrate of a first conductivity type;
a first amorphous semiconductor layer of the first conductivity type on one of the faces of the semiconductor substrate;
a second amorphous semiconductor layer of a second conductivity type on one of the faces of the semiconductor substrate, the second conductivity type opposite to the first conductivity type;
a first electrode electrically connected to the first amorphous semiconductor layer;
a second electrode electrically connected to the second amorphous semiconductor layer;
a first wire connected to a portion of the first electrode via a first conductive adhesive layer; and
a second wire connected to a portion of the second electrode via a second conductive adhesive layer, wherein
the first amorphous semiconductor layer and the second amorphous semiconductor layer are disposed on the same face of the semiconductor substrate,
the first electrode comprises:
a first conductive layer in contact with the first amorphous semiconductor layer, the first conductive layer composed primarily of silver; and
a second conductive layer between the first conductive layer and the first wire, the second conductive layer composed of copper, nickel, aluminum, molybdenum, titanium, or an alloy of some or all of these metals,
the second electrode comprises:
a third conductive layer in contact with the second amorphous semiconductor layer, the third conductive layer composed primarily of silver; and a fourth conductive layer between the third conductive layer and the second wire, the fourth conductive layer composed of copper, nickel, aluminum, molybdenum, titanium, or an alloy of some or all of these metals, the second conductive layer includes a portion connected to the first wire via the first conductive adhesive layer and a portion in direct contact with the first wire, and the fourth conductive layer includes a portion connected to the second wire via the second conductive adhesive layer and a portion in direct contact with the second wire, wherein the first electrode having two ends along a longitudinal direction of the first electrode, the second electrode having two ends along a longitudinal direction of the second electrode, the first conductive adhesive layer is placed only on an edge of the first electrode, and is placed at both ends of the first electrode, and the second conductive adhesive layer is placed only on an edge of the second electrode and is placed at both ends of the second electrode.

2. The photovoltaic device according to claim 1, comprising either one or both of a structure where the second conductive layer is composed of a metal more likely to be oxidized than the first wire and a structure where the fourth conductive layer is composed of a metal more likely to be oxidized than the second wire.

3. The photovoltaic device according to claim 1, comprising either one or both of a structure where the second conductive layer is composed of a metal with a higher hardness than the first wire and a structure where the fourth conductive layer is composed of a metal with a higher hardness than the second wire.

4. The photovoltaic device according to claim 1, wherein the second and fourth conductive layers are composed primarily of nickel.

5. A solar cell module comprising a photovoltaic device according to claim 1.

\* \* \* \* \*